United States Patent
Nemirovsky et al.

(10) Patent No.: US 8,779,543 B2
(45) Date of Patent: Jul. 15, 2014

(54) DEVICE HAVING AN AVALANCHE PHOTO DIODE AND A METHOD FOR SENSING PHOTONS

(71) Applicants: Yael Nemirovsky, Haifa (IL); Vitali Savuskan, Haifa (IL); Sharon Bar-Lev Shefi, Nofit (IL); Igor Brouk, Haifa (IL); Gil Visokolov, Shoham (IL); Amos Fenigstein, Haifa (IL); Tomer Leitner, Nahariya (IL)

(72) Inventors: Yael Nemirovsky, Haifa (IL); Vitali Savuskan, Haifa (IL); Sharon Bar-Lev Shefi, Nofit (IL); Igor Brouk, Haifa (IL); Gil Visokolov, Shoham (IL); Amos Fenigstein, Haifa (IL); Tomer Leitner, Nahariya (IL)

(73) Assignee: Technion Research and Development Foundation Ltd., Haifa (IL)

( * ) Notice: Subject to any disclaimer, the term of this patent is extended or adjusted under 35 U.S.C. 154(b) by 0 days.

(21) Appl. No.: 13/621,244

(22) Filed: Sep. 16, 2012

(65) Prior Publication Data
US 2013/0099091 A1 Apr. 25, 2013

Related U.S. Application Data

(60) Provisional application No. 61/536,076, filed on Sep. 19, 2011.

(51) Int. Cl.
*H01L 31/107* (2006.01)

(52) U.S. Cl.
USPC .... 257/438; 257/439; 257/606; 257/E29.335; 257/E31.116; 438/91

(58) Field of Classification Search
USPC .................. 438/91; 257/186, 438, 439, 606, 257/E31.116, E29.335
See application file for complete search history.

(56) References Cited

U.S. PATENT DOCUMENTS 3,886,579 A * 5/1975 Ohuchi et al. ................ 257/438

* cited by examiner

*Primary Examiner* — Evan Pert
(74) *Attorney, Agent, or Firm* — Oren Reches

(57) ABSTRACT

A semiconductor device that may include an avalanche photodiode (APD), the APD may include: a first doped region of a first polarity; a buried guard ring of a second polarity, the second polarity is opposite to the first polarity, the buried guard ring is spaced apart from the first doped region and is positioned below the first doped region; a well of the second polarity, wherein the well interfaces the first doped region to form a p-n junction; and a second doped region of the second polarity, the second doped region is spaced apart from the first doped region.

49 Claims, 28 Drawing Sheets

Biasing an avalanche photodiode (APD) that comprises: a first doped region of a first polarity; a buried guard ring of a second polarity, the second polarity is opposite to the first polarity, the buried guard ring is spaced apart from the first doped region and is positioned below the first doped region; a well of the second polarity, the well interfaces the first doped region to form a p-n junction; and a second doped region of the second polarity, the second doped region is spaced apart from the first doped region. 92

Sensing, by a readout circuit coupled to the APD, an avalanche process that is triggered by an impingement of at least one photon on the APD. 94

Preparing the APD to sense the next photons. 96

DEVICE HAVING AN AVALANCHE PHOTO DIODE AND A METHOD FOR SENSING PHOTONS

This application claims priority of U.S. provisional patent Ser. date 61/536,076 filing date Sep. 19, 2011 which is incorporated herein by reference.

BACKGROUND OF THE INVENTION

Highly demanding photonic applications require the acquisition of images at very low light-level conditions and at high speed. Only Geiger mode CMOS imager, where the sensor in each pixel is Single Photon Avalanche Photodiode (SPADs), may meet the requirements for exceptional time resolution and ultimate optical sensitivity simultaneously. In spite of impressive progress, Geiger mode CMOS imagers with mega-pixels are still not available commercially.

It is known that a better insight in the evolution of the design and fabrication technology of SPADs up to the most recent results may be gained by looking at it in historical perspective, following the various reported designs and the two fabrication technologies, i.e., standard high-voltage CMOS (HV-CMOS) and dedicated CMOS-compatible technology.

Recent research efforts focus on integration of low-DCR SPADs in state of the art deep submicron CMOS processes and larger SPAD arrays with increasing levels of in-pixel and on-chip signal processing. Both efforts require further scaling of the CMOS SPAD technology as well as pixels, yet achieving high fill factor and low dark count rate (DCR) (below 100 Hz).

Various guard rings have been proposed to avoid edge breakdown. The earlier designs to prevent edge breakdown of a shallow $p^+$-n junction were achieved by using a low-doped $p^-$ guard ring with a typical depth of a few microns, extending much deeper than the junction. This approach was implemented in CMOS technology as well, by implementing the active junction in n-well. This approach significantly reduces the effective fill factor and the Photon Detection Efficiency (PDE) since photo-carriers that reach the guard ring are not multiplied. Instead of employing a lightly doped p– diffused guard ring for reducing the field in the outer region, higher n+ doping was established in the central region for enhancing the electric field. Originally this design was implemented in double-epitaxial SPAD device structure and it has been extended to CMOS technology.

More recently, Finkelstein et al. reported a SPAD device fabricated in a low-voltage 0.18-μm CMOS technology. Edge breakdown is avoided in this device by bounding the active p+-n junction with shallow trench isolation (STI). However, the reported DCR is considerably high, most probably due to the derogative surface effects contributed by the STI surfaces, although it was attributed to strong tunneling and field-enhanced generation effects given the low breakdown voltage of the active junction (~11 V).

It is easily seen that SPADs with conventional guard rings are characterized by effective low fill factor since the active region for multiplication is significantly smaller than the junction area. Hence, the reported low DCR in some of published papers may be attributed to the limited active area for multiplication and not necessarily to high performance. Furthermore, they cannot be scaled much below 5 μm because the depletion regions around the p-well implants expand and merge such that the active area of the SPAD is almost fully depleted. The SPAD then performs like a p-well n-well diode as the p+ n-well breakdown junction no longer operates.

Although 2-μm-active-diameter devices were reported using STI guard rings, hence increasing the fill factor, the dark count was extremely high (hundreds of kilohertz).

The introduction may be concluded by indicating that in spite of all the impressive progress reported in the literature, the reported designs cannot exhibit simultaneously high fill factor, high PDE, and low DCR. With the conventional guard rings, any photo carrier reaching the edges will not be detected since it will not trigger an avalanche. This is especially crucial for small diodes where the edges comprise a considerable portion of the junction area. Small pixels (less than ~30 microns diameter) with small diodes are essential for SPAD arrays providing megapixels and high resolution. A completely new design is imperative in order to achieve SPAD imagers.

SUMMARY OF THE INVENTION

According to an embodiment of the invention a semiconductor device is provided, the semiconductor device includes an avalanche photodiode (APD), the APD may include: a first doped region of a first polarity; a buried guard ring of a second polarity, the second polarity is opposite to the first polarity, the buried guard ring is spaced apart from the first doped region and is positioned below the first doped region; a well of the second polarity, wherein the well interfaces the first doped region to form a p-n junction; and a second doped region of the second polarity, the second doped region is spaced apart from the first doped region. Positive polarity means region doped with acceptors, hence majority carriers are holes. Negative polarity means region doped with donors, hence majority carriers are electrons.

The first polarity may be positive and the second polarity may be negative.

The first polarity may be negative and the second polarity may be positive.

The buried guard ring has a non-uniform doping profile.

The non-uniform doping profile may be arranged to increase a uniformity of an electrical field formed across the p-n junction when the APD may be biased with a bias voltage that facilitates a multiplication of a number of photo-carriers in the depletion region.

The at least one portion of the doping profile may change as a function of a distance from edges of the positive doped region.

The non-uniform doping profile may be set to induce a substantially even electrical field across the p-n junction when being biased with a bias voltage that exceeds a breakdown bias voltage.

The non-uniform doping profile may be set to induce a substantially even electrical field across the p-n junction when being biased with a bias voltage that may be below a breakdown bias voltage.

An area of the buried guard ring may be larger than an area defined by an outer boundary of the first doped region.

An area of the buried guard ring may be at least three times larger than an area defined by an outer boundary of the first doped region.

A sum of (a) an area of a projection of the first doped region on a sensing surface of the APD, and (b) a width of the depletion layer along the sensing surface of the APD may be smaller that (c) an area of a projection of the buried guard ring on the surfing surface of the APD.

The device may include a trench isolation element that may be positioned near an external edge of the APD.

The APD may be without a trench isolation element.

The first doped region and the buried guard ring may be planar.

An area of the sensing surface of the APD does not exceed by microns.

The device may include a readout circuitry; wherein the readout circuitry and the APD form a pixel; wherein a fill factor of the pixel exceeds five percents.

The device may include a readout circuitry; wherein the readout circuitry and the APD form a pixel; wherein a fill factor of the pixel exceeds ten percents.

The device may include readout circuitry; wherein the readout circuitry and the APD form a pixel; wherein a fill factor of the pixel exceeds twenty percents.

The device may include an array of pixels, each pixel comprises an APD and a readout circuit.

The device may include a cooling element.

The entire buried guard ring may be located beneath a surfing surface of the APD.

The well may include at least one sub-region of the second polarity, the at least one sub-region may be proximate to an upper edge of the well and has doping concentration value than a doping concentration value of the well.

A semiconductor device, may include an avalanche photodiode (APD), the APD may include: a first doped region of a first polarity; a guard ring of a second polarity that may be opposite to the first polarity; wherein the guard ring has a first buried portion that may be positioned under the first doped region; wherein the first doped region and the guard ring define a p-n junction; a well of the second polarity that interfaces the guard ring; and a second doped region of the second polarity that may be spaced apart from the first doped region.

The first polarity may be positive and the second polarity may be negative.

The first polarity may be negative and the second polarity may be positive.

The guard ring has a non-uniform doping profile.

The non-uniform doping profile may be arranged to increase a uniformity of an electrical field formed across the p-n junction when the APD may be biased with a bias voltage that facilitates a multiplication of a number of photo-carriers in the depletion region.

The at least one portion of the doping profile changes as a function of a proximity to a sensing surface of the APD.

The at least one portion of the doping profile increases as a function of a proximity to a sensing surface of the APD.

The at least one portion of the doping profile changes as function of a distance from edges of the first doped region.

The non-uniform doping profile may be set to induce a substantially even electrical field across the p-n junction when being biased with a bias voltage that exceeds a breakdown bias voltage.

The non-uniform doping profile may be set to induce a substantially even electrical field across the p-n junction when being biased with a bias voltage that may be below a breakdown bias voltage.

An area of the guard ring may be larger than an area defined by an outer boundary of the first doped region.

An area of the guard ring may be at least three times larger than an area defined by an outer boundary of the first doped region.

A sum of (a) an area of a projection of the first doped region on a sensing surface of the APD, and (b) a width of the depletion layer along the sensing surface of the APD may be smaller that (c) an area of a projection of the guard ring on the surfing surface of the APD.

The device may include a trench isolation element that may be positioned near an external edge of the APD.

The APD may be without a trench isolation element.

The first doped region and the guard ring may be planar.

An area of the sensing surface of the APD does not exceed by microns.

The device may include readout circuitry; wherein the readout circuitry and the APD form a pixel; wherein a fill factor of the pixel exceeds five percents.

The device may include readout circuitry; wherein the readout circuitry and the APD form a pixel; wherein a fill factor of the pixel exceeds ten percents.

The device may include readout circuitry; wherein the readout circuitry and the APD form a pixel; wherein a fill factor of the pixel exceeds twenty percents.

The device may include an array of pixels, each pixel may include an APD and a readout circuit.

The device may include a cooling element.

The well may include at least one sub-region of the second polarity, the at least one sub-region may be proximate to an upper edge of the well and has doping concentration value than a doping concentration value of the well.

A method for sensing photons may be provided and may include: biasing an avalanche photodiode (APD) that comprises: a first doped region of a first polarity; a buried guard ring of a second polarity, the second polarity may be opposite to the first polarity, the buried guard ring may be spaced apart from the first doped region and may be positioned below the first doped region; a well of the second polarity, the well interfaces the first doped region to form a p-n junction; and a second doped region of the second polarity, the second doped region may be spaced apart from the first doped region; and sensing, by a readout circuit coupled to the APD, an avalanche process that may be triggered by an impingement of at least one photon on the APD.

The method may include maintaining an electrical field form across the p-n junction constant while allowing photo-carriers multiplications to occur within a depletion region of the APD.

A method for sensing photons may be provided and may include: biasing an avalanche photodiode (APD) that may include a first doped region of a first polarity; a guard ring of a second polarity that may be opposite to the first polarity; wherein the guard ring has a first buried portion that may be positioned under the first doped region; wherein the first doped region and the guard ring define a p-n junction; a well of the second polarity that interfaces the guard ring; and a second doped region of the second polarity that may be spaced apart from the first doped region; and
sensing, by a readout circuit coupled to the APD, an avalanche process that may be triggered by an impingement of at least one photon on the APD.

The method may include maintaining an electrical field form across the p-n junction constant while allowing photo-carriers multiplications to occur within a depletion region of the APD.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof may best be understood by reference to the following detailed description when read with the accompanying drawings in which:

FIG. 9 illustrates a method according to an embodiment of the invention;

Figure 1:
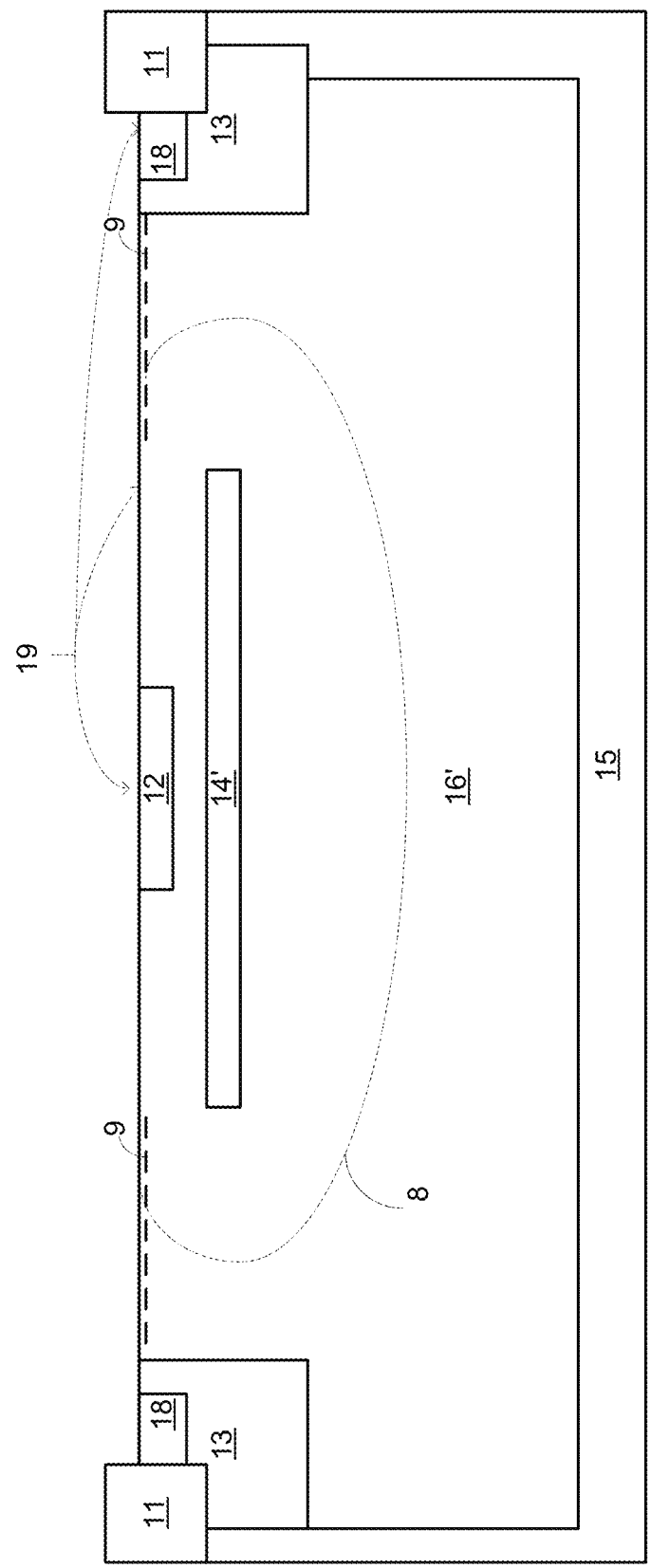
FIG. 1 is a cross sectional view of an avalanche photo diode (APD) according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

There is provided a high-performance APD that can be manufactured by CMOS technologies. The CMOS technologies may include but are not limited to low-voltage 0.18 micron CMOS technology.

The APD may be Geiger mode and act as a SPAD. Alternatively, the APD may be biased by a bias voltage that is below a breakdown bias of the APD and may operate in a linear mode. In any case—the APD should be biased to facilitate a multiplication of photo-carriers generated in the depletion region.

According to an embodiment of the invention the APD may include (a) a first doped region of a first polarity; (b) a buried guard ring of a second polarity, the second polarity is opposite to the first polarity, the buried guard ring is spaced apart from the first doped region and is positioned below the first doped region; (c) a well of the second polarity, the well interfaces the first doped region to form a p-n junction; and (d) a second doped region of the second polarity, the second doped region is spaced apart from the first doped region.

According to an embodiment of the invention a device is provided and may include an avalanche photodiode (APD), the APD may include (a) a first doped region of a first polarity; (b) a guard ring of a second polarity that is opposite to the first polarity; wherein the guard ring has a first buried portion that is positioned under the first doped region; wherein the first doped region and the guard ring define a p-n junction; (c) a well of the second polarity that interfaces the guard ring; and (c) a second doped region of the second polarity that is spaced apart from the first doped region.

The first polarity can be positive and in this case the first doped region can be a positively doped region. The first doped region can be a p type region, a p− type region, a p+ type region or be of any doping concentration value.

The second polarity can be negative and in this case the buried guard ring can be a negatively doped region. The buried guard ring can be an n− type region, an n type region, an n+ type region or be of any doping concentration value.

The first polarity can be negative and in this case the first doped region can be a negatively doped region. The first doped region can be an n type region, an n− type region, an n+ type region or be of any doping concentration value.

The second polarity can be positive and in this case the buried guard ring can be a positively doped region. The buried guard ring can be a p− type region, a p type region, a p+ type region or be of any doping concentration value.

For simplicity of explanation the text below will refer to the first doped region as a p-type anode, will refer to the well as an n-type well, will refer to the buried guard ring as an n-type guard ring and will refer to the second doped region as a n-type cathode. It is noted that the polarity of each of these elements as well as the doping concentration of each of these element can vary from those described in the following text. Thus, for example, the polarity of each of these elements can be reversed. Yet for another example, the first doped region can act as a cathode and the second doped region can act as an anode. Yet for a further example an N-type element can include an N type, an N− type and a N+ type element.

It is noted that the shape of the guard ring can be annular, circular or have any other shape.

For simplicity of explanation only some of the following descriptions refer to Geiger biasing. It is noted that any of the APD described below can also operate in a linear mode and that is may be desired to provided to the APD a bias voltage that facilitates a multiplication of photo-carriers in a depletion layer. It may be desired to operate with a multiplication gain of at least three, of at least four, and the like.

The APD may exhibit at least one of the following characteristics:

a. Planar structure corresponding to CMOS standard technology;
b. Uniform field across a p-n junction area of the APD;
c. No edge effects—lack (or substantially lack of) premature edge breakdown that prevents the APD from reaching a full volumetric breakdown;
d. Having a buried guard ring.
e. Low dark currents due to low surface/interface area;
f. Well-behaved I-V characteristics with abrupt increase of current at breakdown and a single breakdown voltage;
g. Low DCR while maintaining high detection efficiency; and
h. High (quantum efficiency*fill factor).

Figure 8:
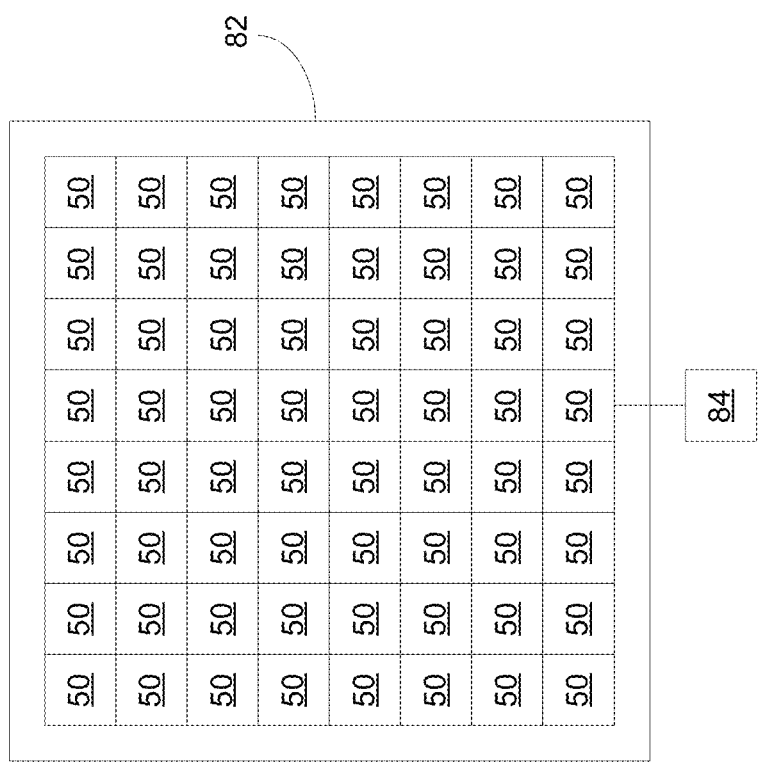
FIG. 8 illustrates a device according to an embodiment of the invention.

A device is provided that may include one or more such APDs. The device can be a digital camera and can be used in various applications such as but not limited to applications that may require achieving detection of fast decaying pulses of photons and achieving 3D imagers that may be used, for example, in land and sea surveyors, virtual keyboards, face recognition systems, non-ionising medical tomographic imagers, stage and choreography analysis tools. FIG. 8 illustrates device 80 according to an embodiment of the invention. The device 80 includes an array of pixels 50 that may be cooled by cooling element 82. The array of pixels is connected to a processor 84. It is noted that the device 80 can have additional elements FIG. 1 is a cross sectional view of an APD 10' according to an embodiment of the invention.

APD' 10 is illustrated as having a p-type anode 12, an n-type buried guard ring 14', an n-type deep well 16, a p-type substrate 15, an n-type cathode 18, and an n-type well 13 that partially surrounds the n-type cathode 18. It is noted that other doping schemes can be applied without departing from the scope of the invention. For example, the anode can be n-type doped while the well, deep well and cathode can be p-type doped. The same can apply to other APDS discussed in this specification.

The p-type anode 12 and the n-type buried guard ring 14' are proximate to each other but are spaced apart from each other. They form a p-n junction that can trigger an avalanche process in response to an impingement of photons on the APD 10'.

Figure 2:
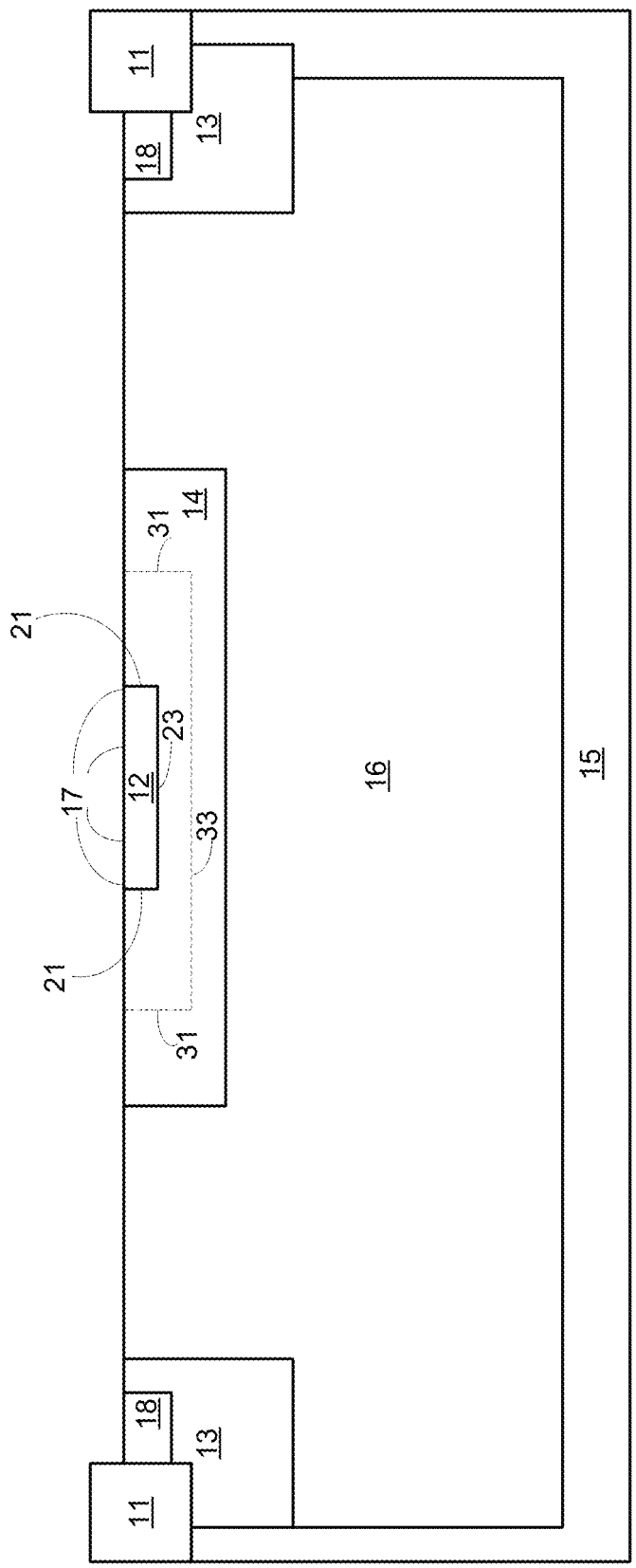
FIG. 2 is a cross sectional view of an avalanche photo diode (APD) according to another embodiment of the invention.

The APD 10' is illustrated as having a sensing surface 19. It is formed by various portions of the p-type anode 12, the n-type buried guard ring 14', the n-type deep well 16, the n-type cathode 18, and an n-type well 13. In FIGS. 1 and 2 this surface is an upper surface of the APD 10 but this is not necessarily so. The sensing surface 19 is illustrated as being located in a plane that is normal to the page of FIG. 1. The sensing surface 19 is termed sensing because photons are expected to impinge on this surface and even penetrate this surface.

The bottom of p-type substrate 15 is parallel to and opposite to the sensing surface 19.

For clarity of explanation the term area will refer to an area at the sensing surface 19 while the term depth will refer to a distance from the sensing surface 19. For example, if the sensing surface 19 is positioned in an imaginary X-Y plane then the depth is measured along an imaginary Z-axis. Thus, for example, an area of the p-type anode 12 is its area within the sensing surface 19.

The p-type anode 12 has a smaller area then the area (along an imaginary X-Y plane parallel to the sensing surface 19) of the n-type buried guard ring 14'. The ratio between these areas can be, for example, in the range between 2 and 8.

According to an embodiment of the invention the p-type anode 12 and the n-type buried guard ring 14' are shaped as disks while the n-type cathode 18 and an n-type well 13 are shaped as hollow cylinders. It is noted that each of these buried guard rings can have a different shape. For example, the p-type anode can have can cross section (along an imaginary Z plane) that is half of an ellipse.

According to an embodiment of the invention the radius of the n-type buried guard ring 14' (Re) can be greater than a sum of (a) the radius of the p-type anode (Ra) and (b) a width (Wdp) of the depletion layer (the width is denoted 55 in FIG. 4): Re>Ra+Wdp.

It is noted that FIG. 1 also illustrates two n-type sub-regions 9 that are proximate to an upper edge of the well and have doping concentration value that may be higher (or otherwise different) than a doping concentration value of the well. They can be used for reducing edge effects.

FIG. 1 also illustrates boundary 8 of a depletion layer. It is noted that the size and shape of the depletion layer can change—as a function of the bias voltage provided to the APD and as a function of the structure and the materials from which the APD is made of.

FIG. 2 illustrates an APD 10 according to another embodiment of the invention.

APD 10 of FIG. 2 differs from APD 10' of FIG. 1 by the shape and location of its n-type guard ring 14. While in FIG. 1 the n-type guard ring 14' is shaped as a disk and is parallel to (but spaced apart from) the p-type anode 12, the n-type guard ring 14 contacts the p-type anode 12 at all sides of the p-type anode 12 except the sensing side 17 of the p-type anode 12. The sensing side 17 forms a part of the sensing surface 19. Thus, the n-type guard ring 14 of FIG. 2 partially surrounds the p-type anode 12. The sensing side 17 can be an area out of the entire sensing surface.

The n-type guard ring 14 has a non-uniform doping profile. This non-uniform doping profile can assist in forcing a uniform electrical field across the p-n junction formed between the n-type guard ring 14 and the p-type anode 12. This uniformity (or almost uniformity) reduces the draw backs of perimeter breakdowns—especially premature breakdowns that are not shared across the entire p-n junction. Accordingly—these perimeter breakdowns can be used for detection of photons and should not be prevented.

It is noted that the p-h junction has a p-n interface and that the electrical field may vary as a function of proximity from the p-n interface. The electrical field is maintained uniform (or substantially uniform) at points that are located at substantially the same distance from the p-n interface. A non-limiting example of such a uniform electrical field is illustrated in FIG. 4.

Thus, if at an absence of the non-uniform doping profile (of the n-type guard ring 14) the electrical field formed across the p-n junction has a certain profile, the non-uniform doping profile can be shaped to counter this profile.

According to an embodiment of the invention at least a portion of the doping profile may change as a function of a proximity to a sensing surface of the APD. For example, dashed lines 33, and 31 represent an imaginary cross section of the n-type guard ring 14.

Dashed line 33 is parallel to the lower surface 23, of the p-type anode 12, parallel to the sensing surface 19 and spaced apart from both. Dashed lines 31 are located at both sides of the p-type anode 12 and are parallel to the sidewalls 21 of the p-type anode 12. The dashed lines 31 are substantially vertical to the sensing surface 19 and are spaced apart from the p-type anode 12.

The doping across dashed line 33 is constant. The doping across dashed lines 31 changes as a function of the proximity of the sensing surface 19. For example—the doping can decrease (in a linear or non-linear manner) with the distance to the sensing surface 19.

It is noted that either one of the elements (11, 13, 12, 14, 16 and 18) may differ from the shape illustrated in FIGS. 1 and 2. Such changes of shape can also result in changes in the doping profile. As a rule of thumb, the doping profile is designed to assist in providing a uniform (or substantially uniform) electrical field across the p-n junction—even at the presence of p-type anode edges. Those of skill in the art will appreciate that the electrical field across such a p-n junction can be simulated, measured or otherwise calculated and that the desired doping profile can be designed accordingly.

Figure 3A:
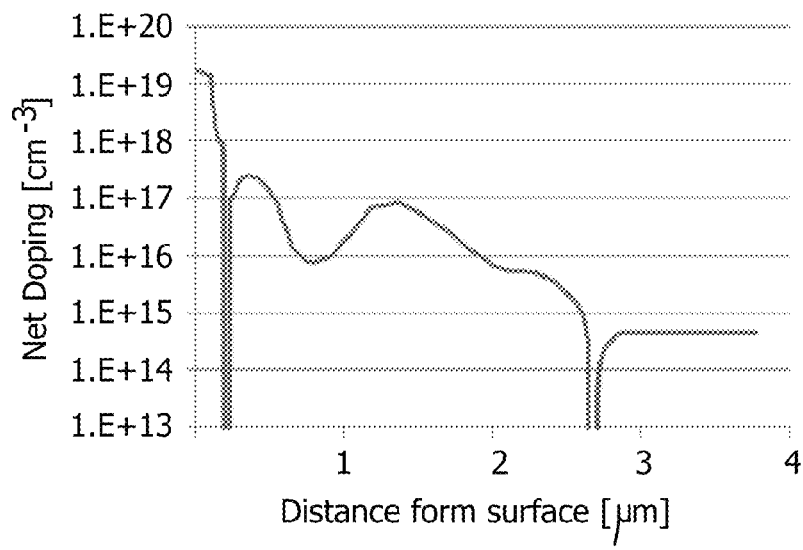
FIGS. 3A-3D illustrate doping profiles of portions of APDs of FIG. 1 and FIG. 2 according to an embodiment of the invention.
Figure 3B:
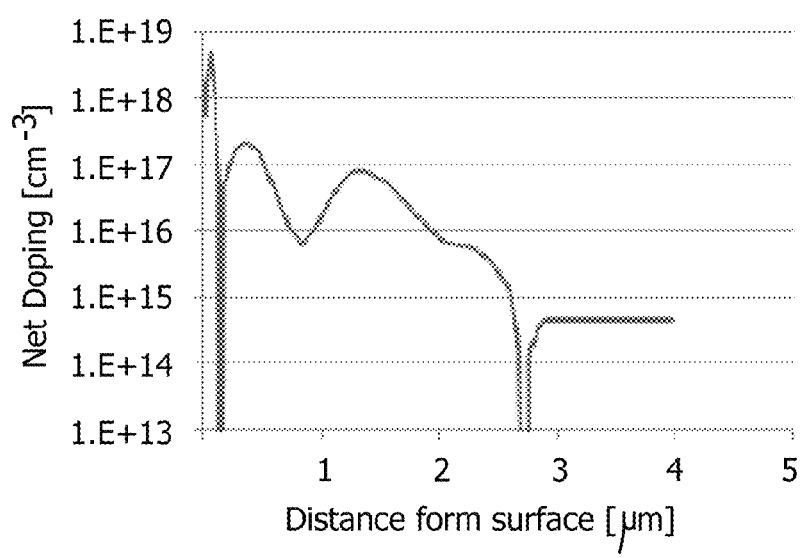
Figure 3C:
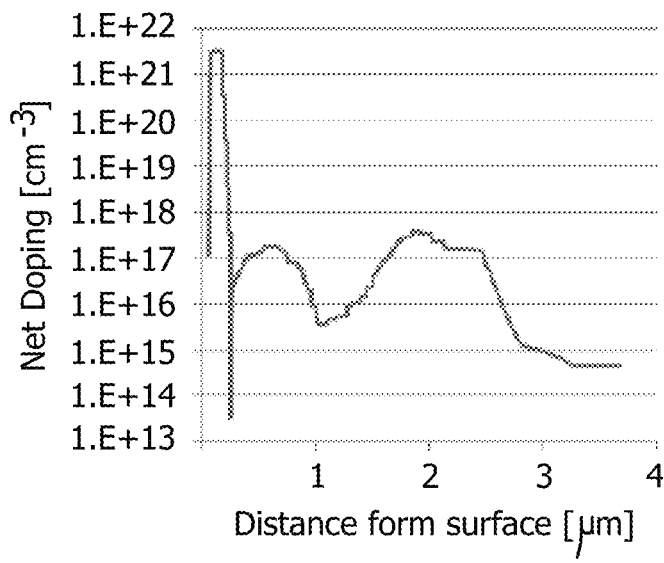
Figure 3D:
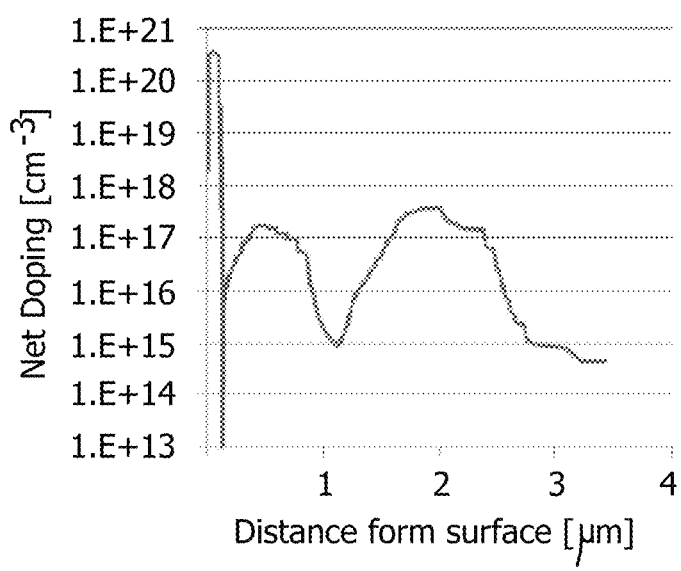

FIGS. 3A-3D illustrate doping profiles of portions of APDs of FIG. 1 and FIG. 2 according to an embodiment of the invention. FIG. 3A is a doping profile taken from a middle of the device of FIG. 1A, FIG. 3A is a doping profile taken from a middle of the device of FIG. 1A, FIG. 3B is a doping profile taken at an edge of the device of FIG. 1A, FIG. 3C is a doping profile taken from a middle of the device of FIG. 1B, and FIG. 3D is a doping profile taken at an edge of the device of FIG. 1B.

FIGS. 4A-4D illustrate simulation of the electrical field developed in the APDs of FIGS. 1 and 2 according to an embodiment of the invention.

Figure 4A:
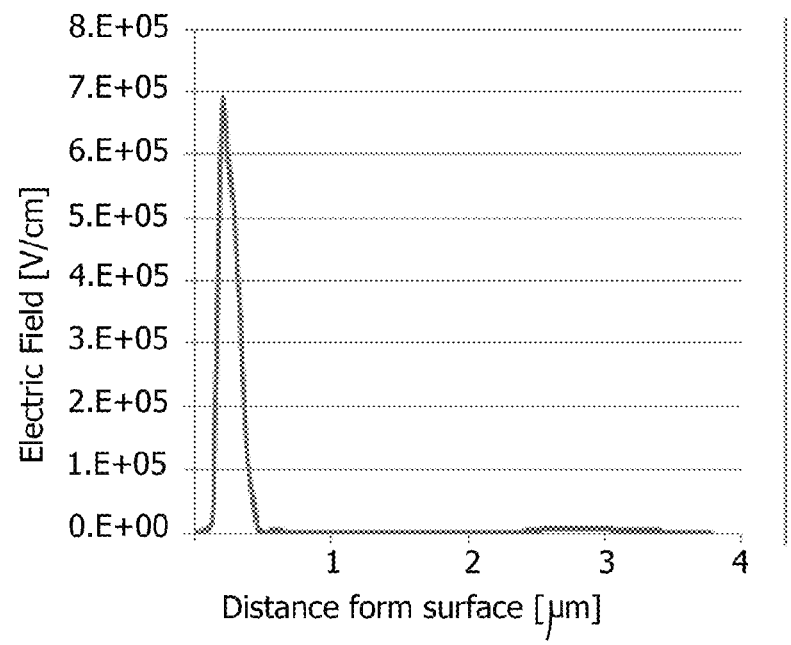
FIGS. 4A-4D illustrate simulation of the electrical field developed in the APDs of FIGS. 1 and 2 according to an embodiment of the invention.
Figure 4B:
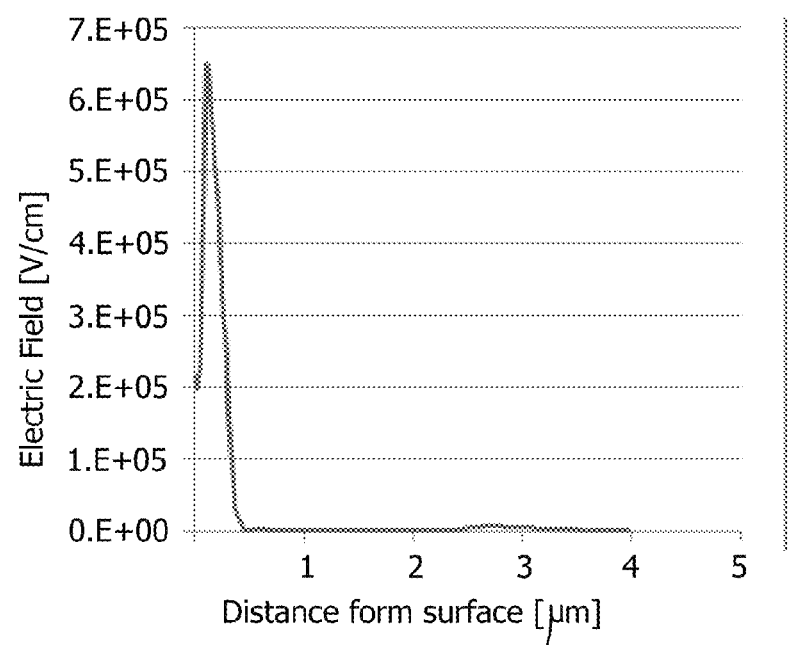
Figure 4C:
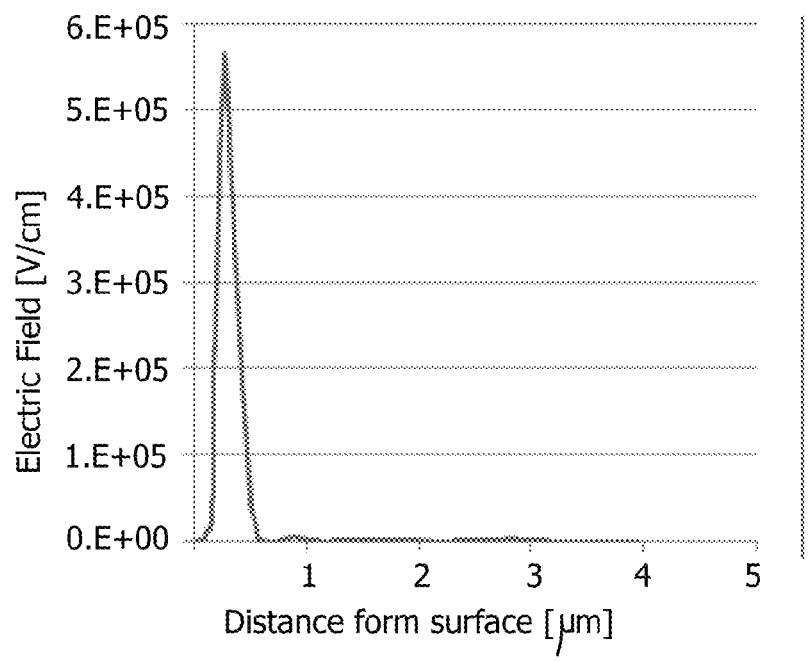
Figure 4D:
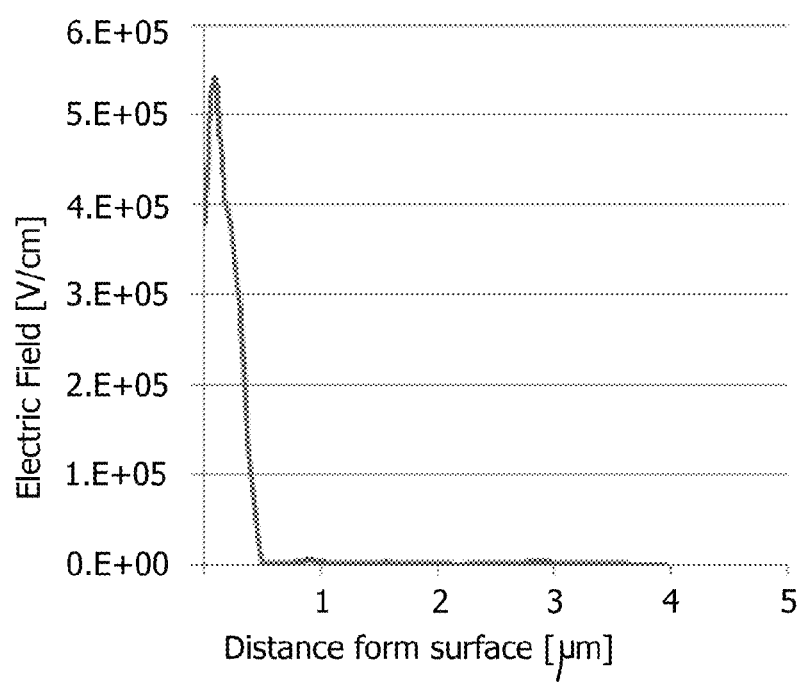

FIG. 4A is a simulation of the electrical field developed in the middle of the device of FIG. 1A, FIG. 4B is simulation of the electrical field developed in the edge of the device of FIG. 1A, FIG. 4C is simulation of the electrical field developed in the middle of the device of FIG. 1B, and FIG. 4D is simulation of the electrical field developed in the edge of the device of FIG. 1B.

Figure 5:
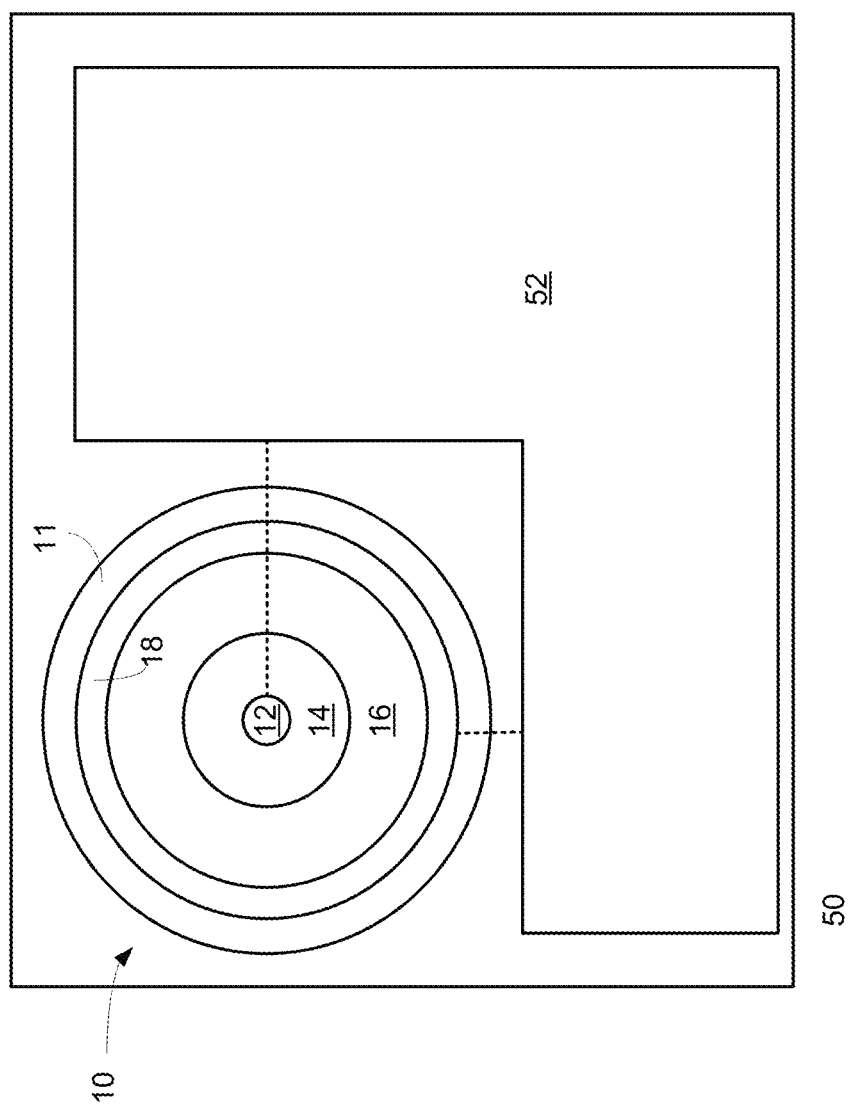
FIG. 5 is a top view of a pixel according to an embodiment of the invention.

FIG. 5 is a top view of a pixel 50 according to an embodiment of the invention. The pixel 50 includes an APD 10 and a readout circuit 52. The APD 10 is illustrated as having a round shape, wherein the p-type anode 12 has a circular shape, and other elements (such as 11, 14, 16 and 18) have an annular shape. Readout circuit 52 is illustrated as being connected to p-type anode 12 and to n-type cathode 18.

It is noted that the shape of the APD can differ from the shape illustrated in FIG. 5, that the shape of the readout circuit can differ from those illustrated in FIG. 5 and that APD 10' of FIG. 1 can be included in such a pixel.

The area of the APD 10 can be a large fraction of the area of the pixel 50, thus contributing to the collection efficiency of the pixel 50. The readout circuit 52 can apply any readout mechanism known in the art such as but not limited to quenching, shaping, counting and multiplexing According to various embodiments of the invention the fill factor of the pixel 50 is high and can exceed, for example, few percents, 5 percent, 10 percent, 15 percent, 20 percent, 25 percent, 30 percent, 35 percent, 40 percent, 45 percent, 50 percent, 55 percent, and the like.

The fill factor can be defined as a ratio between the volume of the pixel (Vpixel) and a sensing volume that is a volume of the pixel in which there is a non-negligible probability that a charge carrier (created by a photon) will be detected—will cause an avalanche process. The non-negligible probability may be ten percent or more.

Figure 6:
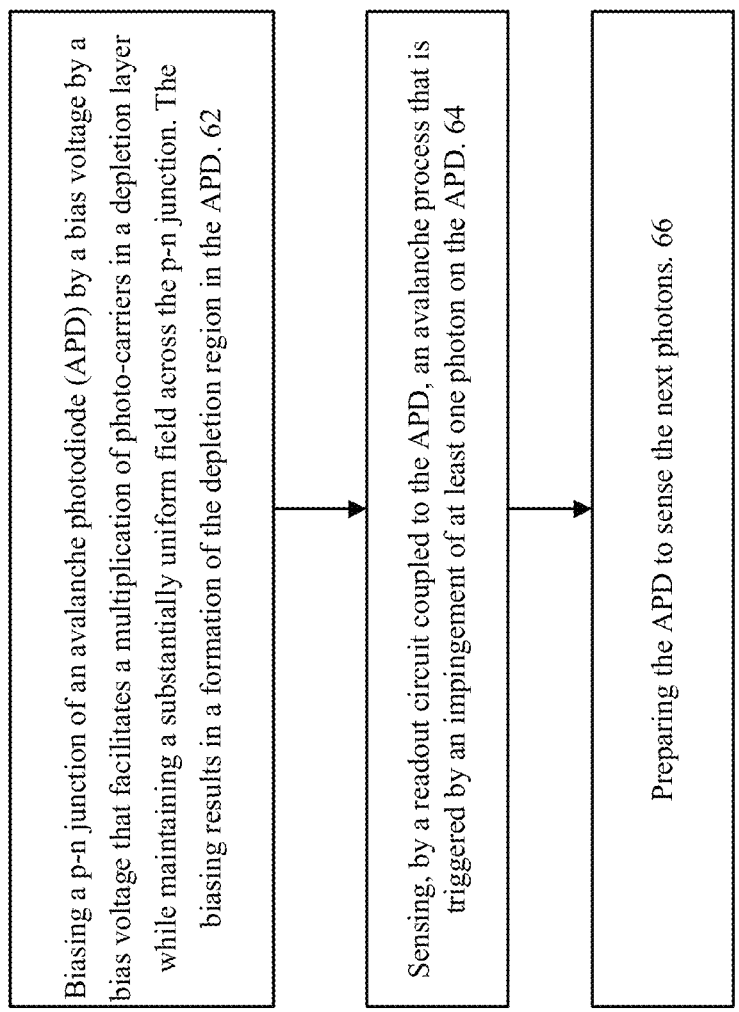
FIG. 6 illustrates a method according to an embodiment of the invention.

FIG. 6 illustrates method 60 according to an embodiment of the invention.

Method 60 can be executed by pixel 50 or by any pixel that includes APDs such as but not limited to APD 10 and APD 10'.

Method 60 starts by stage 62 of biasing a p-n junction of an avalanche photodiode (APD) by a bias voltage that of biasing a p-n junction of an avalanche photodiode (APD) by a bias voltage that facilitates a multiplication of photo-carriers in a depletion layer while maintaining a substantially uniform field across the p-n junction. The biasing results in a formation of the depletion region in the APD. Thus, the biasing can include Geiger biasing or linear mode biasing. It may be desired to operate with a multiplication gain of at least three, of at least four, and the like.

Stage 62 is followed by stage 64 of sensing, by a readout circuit coupled to the APD, an avalanche process that is triggered by an impingement of at least one photon on the APD.

Stage 64 can be followed by stage 66 of preparing the APD to sense the next photons. This can include quenching (dropping the bias voltage below the breakdown voltage) and after a predetermined period—jumping to stage 62 and biasing the APD.

It is noted that method 60 can be applied to an array of pixels. Each pixel (or group of pixels) of the array can be independently controlled—thereby stages 62-66 can be executed independently by each pixel or group of pixels.

Figure 7:
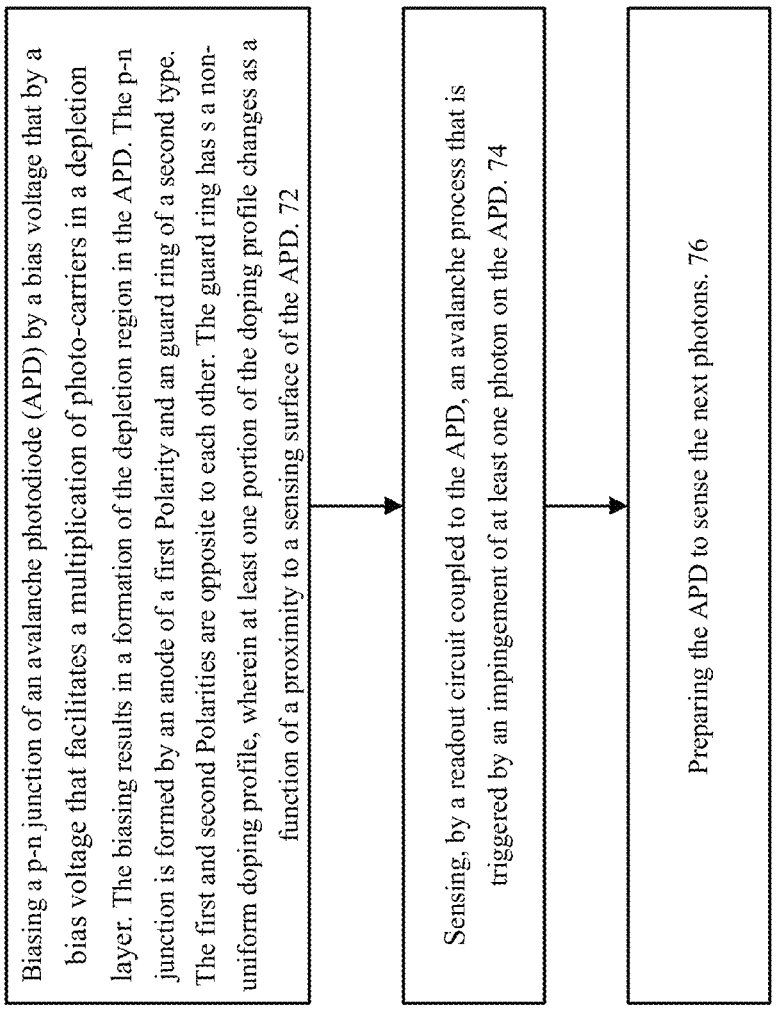
FIG. 7 illustrates a method according to an embodiment of the invention.

FIG. 7 illustrates method 70 according to an embodiment of the invention.

Method 70 can be executed by pixel 50 or by any pixel that includes APDs such as but not limited to APD 10 and APD 10'. Method 70 can be executed by an array of such pixels.

Method 70 starts by stage 72 of biasing a p-n junction of an avalanche photodiode (APD) by a bias voltage that facilitates a multiplication of photo-carriers in a depletion layer. The biasing results in a formation of the depletion region in the APD. The p-n junction is formed by an anode of a first polarity and a guard ring of a second polarity. The first polarity and the second polarity are opposite to each other. The guard ring has a non-uniform doping profile, wherein at least one portion of the doping profile may change as a function of a proximity to a sensing surface of the APD.

Stage 72 is followed by stage 74 of sensing, by a readout circuit coupled to the APD, an avalanche process that is triggered by an impingement of at least one photon on the APD.

Stage 74 can be followed by stage 76 of preparing the APD to sense the next photons. This can include quenching (dropping the bias voltage below the breakdown voltage) and after a predetermined period—jumping to stage 72 and biasing the APD by a bias voltage that facilitates a multiplication of photo-carriers in a depletion layer. The biasing results in a formation of the depletion region in the APD. Thus, the biasing can include Geiger biasing or linear mode biasing. It may be desired to operate with a multiplication gain of at least three, of at least four, and the like.

FIG. 9 illustrates method 90 according to an embodiment of the invention.

Method 90 can be executed by pixel 50 or by any pixel that includes APDs such as but not limited to APD 10 and APD 10'. Method 90 can be executed by an array of such pixels.

Method 90 starts by stage 92 of biasing an avalanche photodiode (APD) that comprises: a first doped region of a first polarity; a buried guard ring of a second polarity, the second polarity is opposite to the first polarity, the buried guard ring is spaced apart from the first doped region and is positioned below the first doped region; a well of the second polarity, the well interfaces the first doped region to form a p-n junction; and a second doped region of the second polarity, the second doped region is spaced apart from the first doped region.

Stage 92 is followed by stage 94 of sensing, by a readout circuit coupled to the APD, an avalanche process that is triggered by an impingement of at least one photon on the APD.

Stage 94 can be followed by stage 96 of preparing the APD to sense the next photons. This can include quenching (dropping the bias voltage below the breakdown voltage) and after a predetermined period—jumping to stage 92.

Stage 92 may include maintaining an electrical field form across the p-n junction constant while allowing photo-carriers multiplications to occur within a depletion region of the APD.

Figure 10:
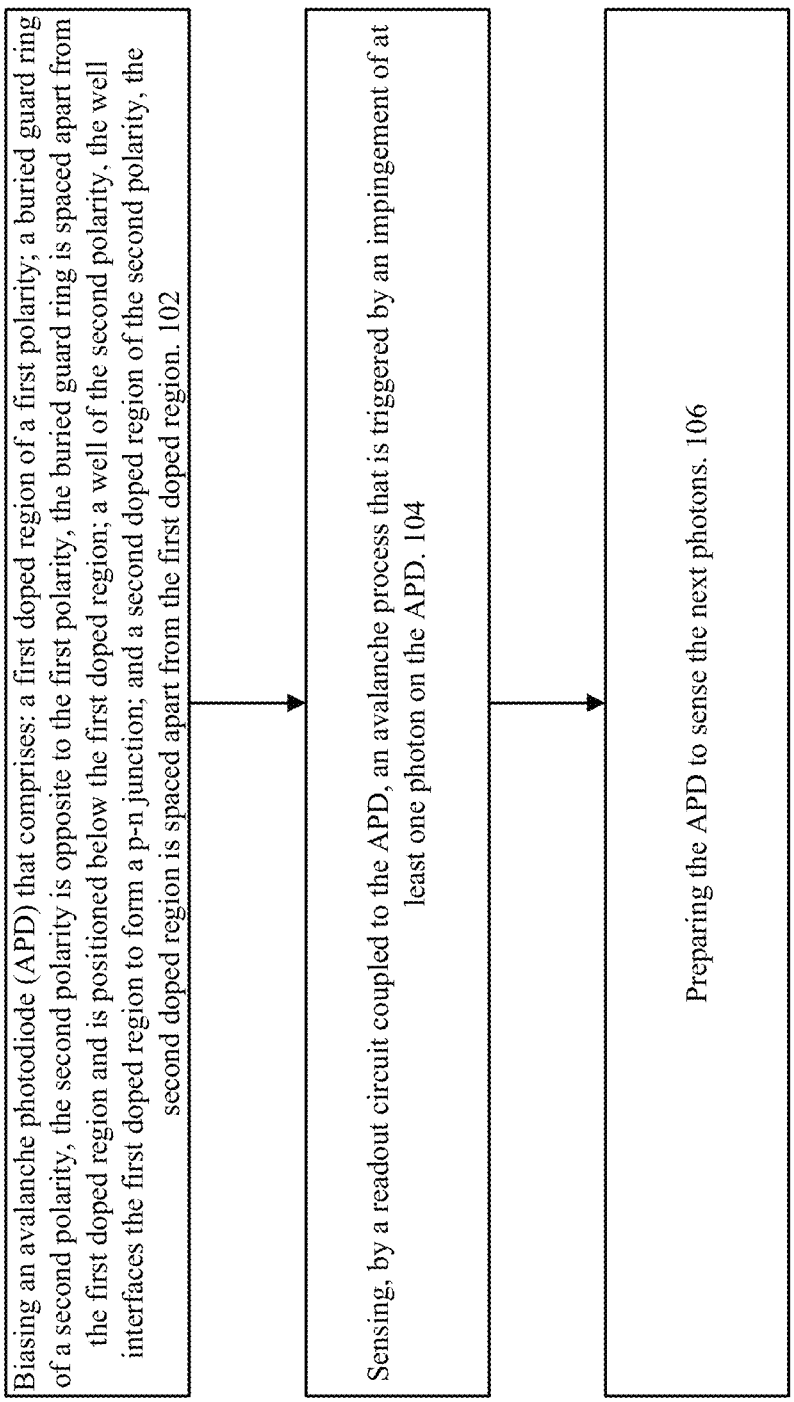
FIG. 10 illustrates a method according to an embodiment of the invention.
Figure 11:
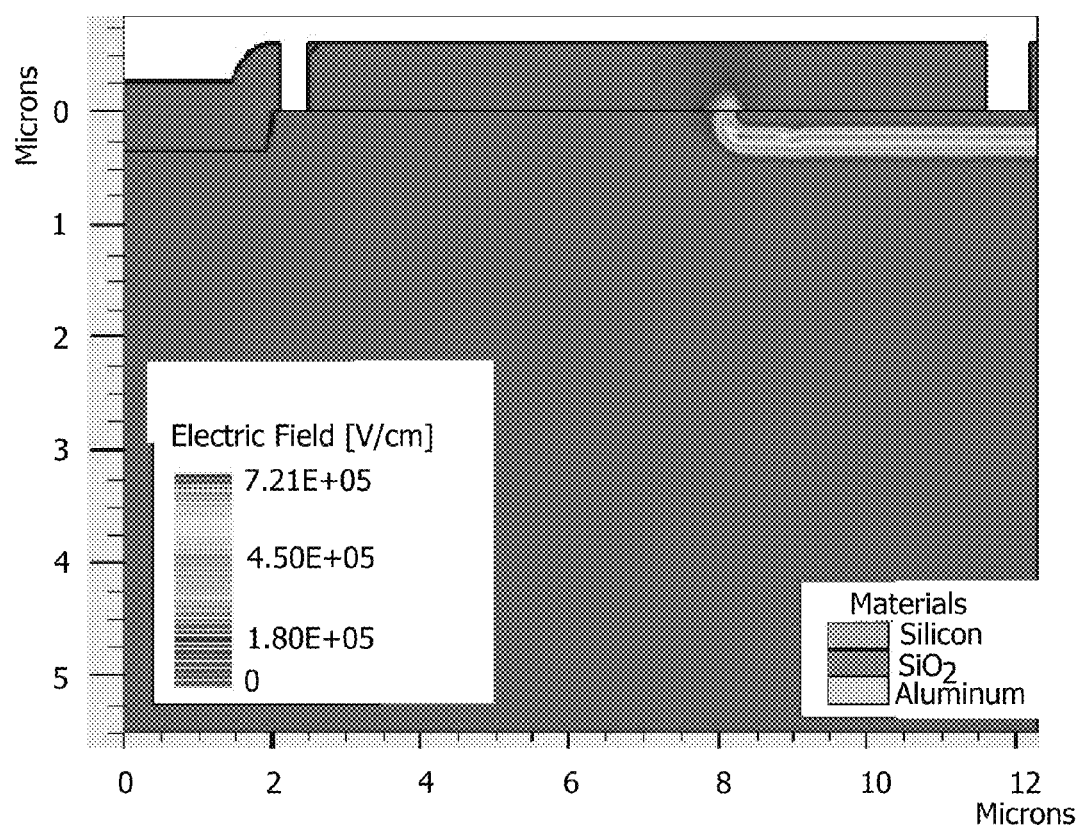
FIG. 11 illustrates electrical field two dimensional cross section, according to embodiments of the invention.

FIG. 10 illustrates method 100 according to an embodiment of the invention.

Method 100 can be executed by pixel 50 or by any pixel that includes APDs such as but not limited to APD 10 and APD 10'. Method 100 can be executed by an array of such pixels.

Method 100 starts by stage 102 of biasing an avalanche photodiode (APD) that comprises a first doped region of a first polarity; a guard ring of a second polarity that is opposite to the first polarity; wherein the guard ring has a first buried portion that is positioned under the first doped region; wherein the first doped region and the guard ring define a p-n junction; a well of the second polarity that interfaces the guard ring; and a second doped region of the second polarity that is spaced apart from the first doped region.

Stage 102 is followed by stage 104 of sensing, by a readout circuit coupled to the APD, an avalanche process that is triggered by an impingement of at least one photon on the APD.

Stage 104 can be followed by stage 106 of preparing the APD to sense the next photons. This can include quenching (dropping the bias voltage below the breakdown voltage) and after a predetermined period—jumping to stage 92.

State of the art CMOS processes (180 nm and below) offer triple well process. The triple wells were originally employed to completely isolate p-well regions in order to better isolate n-channel MOS (NMOS) transistors from the substrate. These processes are characterized by deep high-energy ion implantation steps, formation of deeply buried high doping implants and retrograde doping profile where the low surface doping increases with depth. These processing opportunities are exploited in the new SPAD structure described in this study.

Various embodiments of cross sections of devices according to various embodiments of the invention, examples of doping and examples electric field profiles along the center and the edges of these devices were shown in FIGS. 1,2 3A-3D and 4A-4D.

The new devices may be shallow, round and small planar implanted junction (2-μm-active-diameter). A deep and buried implanted charge sheet with larger dimensions than the shallow junction provides a well-defined multiplication region (FIGS. 1 and 2).

At the same time, it forms an effective buried guard ring by lowering the field at the periphery of the junction (FIGS. 4A-4D and 11) so that practically a uniform field is obtained across the junction. Thus this design is achieved without the conventional surface guard rings and there is minimal interaction with the surface. Because of the small junction area, uniform electric field is established across the entire junction. This provides abrupt I-V characteristics with well defined breakdown voltage, instead of the smeared I-V characteristics that are observed in larger junctions. Hence, this design simultaneously provides high effective fill factor and low dark count rate (DCR).

These device may exhibit better yield and uniformity, higher spatial uniformity, reduced capacitance and hence lower dead-time and lower jitter.

The charge sheet concept was previously proposed for APDs implemented in InGaAs [16, 17] and could be extended to non-CMOS silicon devices based on the growth of epilayers.

The Charge Sheet (CS) concept essentially implements "capacitor plates" that bound the electric field to a well defined region. The CS can be implemented using ion implantation with the CMOS process. Using the CS concept, a P+/N−/N+ (FIG. 1a) or N+/P−/P+ (FIG. 1b) structure is being formed where the lightly doped region (P− or N−) is approximately 200 nm thick. The highly doped regions above and below the lightly doped regions effectively establish the field, resulting in a very small potential drop on these layers. In this case, most of the applied voltage is contributing to the electric field at the multiplication region, which results in a low breakdown voltage.

Thus, the "charge Sheet Design" enables well-controlled multiplication field as well as well-controlled multiplication path. These two parameters also determine the required breakdown voltage, the Photon Detection Efficiency (PDE) and the parasitic tunneling events. A design goal is an electric field of the order $$\sim 500 \frac{\text{kV}}{\text{cm}} = 50 \frac{\text{V}}{\mu\text{m}}$$

that will initiate the avalanche process with negligible tunneling effect. The expected breakdown voltage for such design is of the order of $$BV \approx E_{avalanche} \cdot x_{mult} = 50 \frac{\text{V}}{\mu\text{m}} \cdot 0.2 \ \mu\text{m} = 10 \ \text{V},$$

where $E_{avalanche}$ is the approximate average field in the multiplication region and $x_{mult}$ is the width of the multiplication region, defined by the lightly doped region.

In contrast, the electric field of one sided step junction, which is not based on the charge sheet concept, is decreasing linearly with distance, with a slope dependant on the doping concentration of the less doped region. As a result, the multiplication region of such a junction is very narrow unless the breakdown voltage is high, resulting in poorer performance.

The Charge Sheet layer provides more than a well controlled multiplication area. The Charge Sheet layer provides an extra degree of freedom, which permits independent control of the Electric field profiles in the active region and the device periphery. Accordingly, the Electric field profile at the edges may be tailored to avoid enhanced breakdown. Thus, the Charge Sheet provides a buried guard ring that controls the electric field at the periphery.

By careful design of the charge sheet, the electric field in the active region of the junction and in the periphery of the junction, are tailored to be nearly equal. This is achieved by extending the CS laterally beyond the region where it overlaps the highly doped region of the junction (see FIGS. 1 and 2). In this manner, the electric field in the edges is approximately equal to that in the planar region (see FIGS. 3A-3D and 11).

Accordingly, an APD junction with uniform avalanche field is demonstrated. To achieve that, a special care must be taken to tailor the doping profile in the perpendicular direction (see FIGS. 3A-3D) and to design carefully the location of the edge of the CS beyond the highly doped region. Simulations indicate that the CS must extend beyond the highly doped region by a distance not lower than the depletion layer width of the junction when biased above breakdown.

In this manner, the Charge Sheet layer achieves two important engineering advantages: (i) it provides a buried guard ring free of detrimental surface effects and (ii) it provides a SPAD with uniform avalanche field. The latter advantage is in particular important for improving the fill factor. All the conventional guard rings discussed in section 1 provide electric field in the edges which are much lower than the electric field in the planar region. Accordingly, while there is considerable multiplication in the planar region of the diode, any photo carrier reaching the edges will not trigger an avalanche. This is especially significant for small diodes where the edges compromise a considerable portion of the junction area. When considering SPAD array with mega pixels and high resolution, the array must be comprised of small diodes.

The device of FIG. 1 can be referred as having a N+P design while the device of FIG. 2 can be referred as having a P+N design.

The N+P design is uncommon because it's more difficult to integrate the SPAD with the in-pixel circuitry. In FIG. 2 we notice that the deep Pwell of the SPAD is shared with the common P-substrate commonly used in deep sub-micron CMOS technology. This feature requires the in-pixel circuitry to be isolated from the P-substrate using standard deep Nwell implants.

This adds complexity to the layout of the in-pixel circuitry. With careful design and calibration the in-pixel circuitry can be integrated with the N+P design, however the cost is somewhat lower FF due to the design rules of the minimum spacing between deep Pwell and deep Nwell layers. Furthermore, due to the fact that all the p-side regions are shortened by the p-substrate, the options to the readout circuitry connectivity are somewhat limited.

Considering the above disadvantage, the N+P design exhibits two considerable advantages to the P+N design. The N+P avalanche is electron initiated avalanche. In silicon, the electron ionization coefficient is larger than the hole ionization coefficient.

The avalanche is initiated by electrons because most of the absorption occurs in the deep Pwell where the electrons are the minority carriers. Considering a N+P design with the same doping profile as the P+N design (with N-type layers instead of P-type and vice versa), a smaller electric field is needed for the breakdown of the device. Smaller electric field will result in less tunneling and lower DCR.

Figure 12:
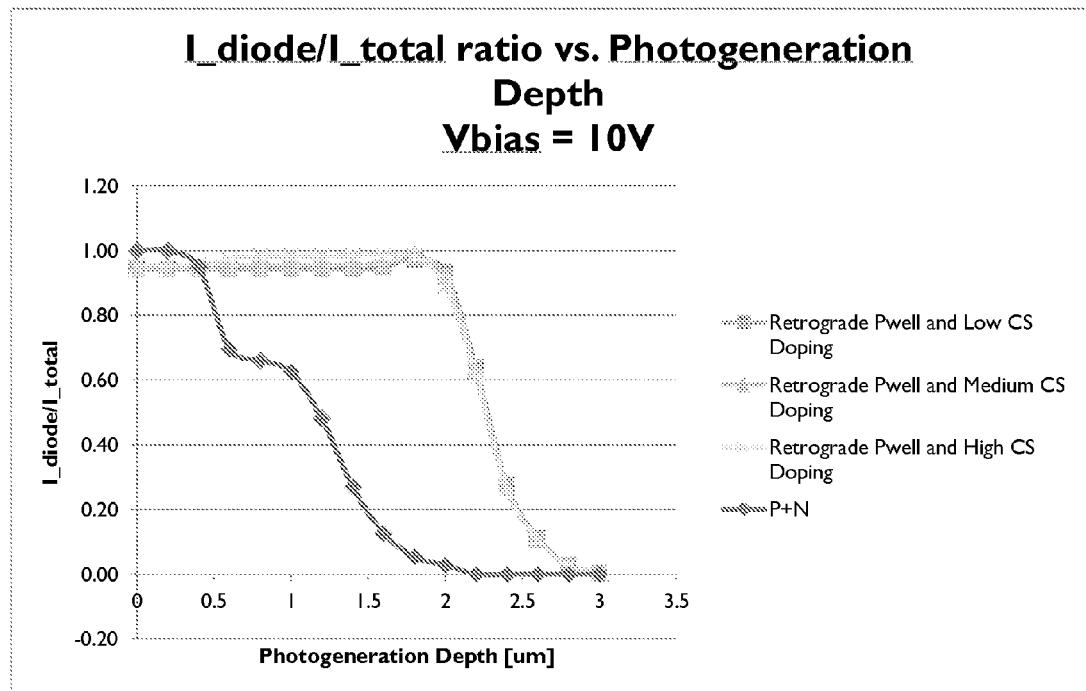
FIG. 12 illustrates a charge collection efficiency of the P+N design as well as several N+P designs with varying CS doping concentration, according to embodiments of the invention.

The second significant advantage of the N+P design lies in the implant capabilities of the commercial CMOS process. Deep well implants use high energy implants. Each fab has set its own limitation regarding the dose and the energy used for each implant where there is a tradeoff between energy and dose. One can't simultaneously implant high dose as well as high energy. Deep Nwell implants use phosphorus impurity, while Deep Pwell implants use the boron impurity. phosphorus is heavier than boron resulting in the need to implant the impurity with higher energies in order to reach the required depth. This higher energy results in lower dose of phosphorus implanted and lower doping concentration. When implanting Deep Pwells using boron, one needs to use much lower energy in order to reach the required depth, allowing the designer to use higher doses resulting in higher deep Pwell doping concentrations. The higher doping concentration (FIG. 3A-3D) causes the retrograde well effect and substantially increases collection efficiency (FIG. 12). The importance of retrograde well is discussed below.

The collection efficiency is defined as the fraction of the photogenerated carriers, which are generated randomly within the pixel, to reach the multiplication region. When considering small active area diameter, i.e. small multiplication regions, most of the carriers generated in the pixel reaches the periphery (edges) of the junction. In order to facilitate and increase the reported PDE in the literature, one must have uniform breakdown all over the P-N junction.

An analytical approximation for the collection efficiency can be formulated. Photogenerated electron-hole pair generated inside the deep well has two potential barriers blocking its way. For simplicity, we will assume the N+P design with the retrograde effect and examine the minority carriers: electrons in deep Pwell. The following derivation can be applied to holes in deep Nwell in the P+N design with the same result. The electron can either reach the P-substrate (with lower doping concentration than the deep Pwell) or the N+ region.

Figure 13:
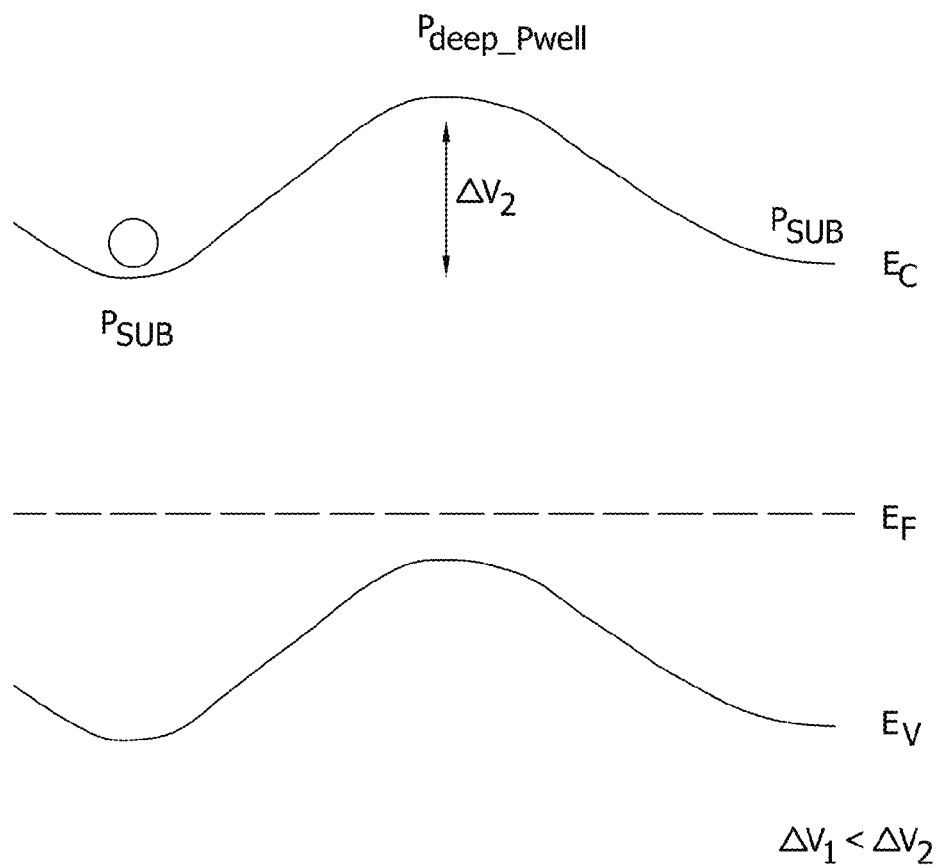
FIG. 13 illustrates barriers of an electron in the N+P retrograde deep Pwell; according to embodiments of the invention.

The barriers illustrated in FIG. 13 have the following potential barrier:

$$\Delta V_1 = \frac{kT}{q}\ln\left(\frac{P_{CS}}{P_{sub}}\right)$$

$$\Delta V_2 = \frac{kT}{q}\ln\left(\frac{P_{DPW}}{P_{sub}}\right)$$

$$\frac{\text{probability to overcome the } CS \text{ barrier}}{\text{probability to overcome the deep well barrier}} = \frac{e^{-\frac{q}{kT}\Delta V_1}}{e^{-\frac{q}{kT}\Delta V_2}}$$

$$= \frac{e^{-\frac{q}{kT}\frac{kT}{q}\ln\left(\frac{P_{CS}}{P_{sub}}\right)}}{e^{-\frac{q}{kT}\frac{kT}{q}\ln\left(\frac{P_{DPW}}{P_{sub}}\right)}}$$

$$= \frac{e^{-\ln\left(\frac{P_{CS}}{P_{sub}}\right)}}{e^{-\ln\left(\frac{P_{DPW}}{P_{sub}}\right)}}$$

$$= \frac{e^{-\ln\left(\frac{P_{sub}}{P_{CS}}\right)}}{e^{-\ln\left(\frac{P_{sub}}{P_{DPW}}\right)}}$$

$$= \frac{\frac{P_{sub}}{P_{CS}}}{\frac{P_{sub}}{P_{DPW}}}$$

$$= \frac{P_{DPW}}{P_{CS}}$$

Where $\Delta V_1$ is the barrier the electron has to overcome to reach the multiplication region, $\Delta V_2$ is the barrier the electron has to overcome to reach the substrate and go virtually undetected. The probability to overcome the barriers was taken to be the Maxwell-Boltzmann probabilities. In the above derivation we assumed life time long enough so the electron crosses the barrier before it recombines.

When the deep well is doped higher than the CS, its barrier is larger making the junction with multiplication a favorable destination for the minority carrier. As previously mentioned, the deep Pwell is doped higher than the CS. When considering the P+N structure, the previous claim is untrue, the deep Nwell is doped lower than the CS. Therefore, any photogenerated electron-hole pair generated in the deep Pwell is collected very efficiently by the junction undergoing breakdown.

Collection efficiency simulations were conducted in order to validate our analytical approximation and better assess the transport of electrons in the N+P design with the retrograde effect. The simulations included a device simulated in Silvaco's process simulator—Athena. The simulation deck was calibrated to the fab's manufacturing capabilities. After the process simulation, a device simulation was executed using Silvaco's device simulator—Atlas. The device simulation included the transport equations for electrons and holes and the Gauss equation. Since we wanted to examine the transport of the electrons and the location of interception with the multiplication junction, we had no interest in impact ionization simulation. The exclusion of the impact ionization models made the simulation much less computationally intensive.

Figure 14A:
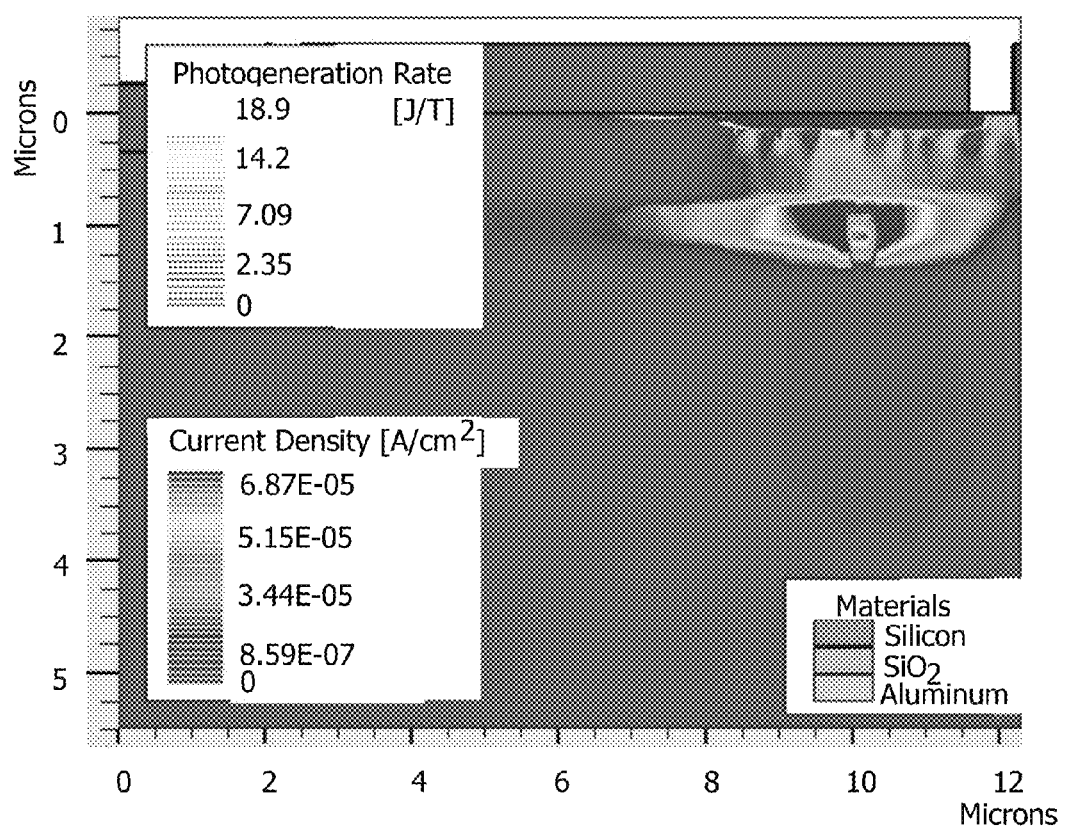
FIGS. 14A and 14B illustrate minority carriers current distribution from different sources exactly under the planar junction and laterally away from the planar junction, according to embodiments of the invention.
Figure 14B:
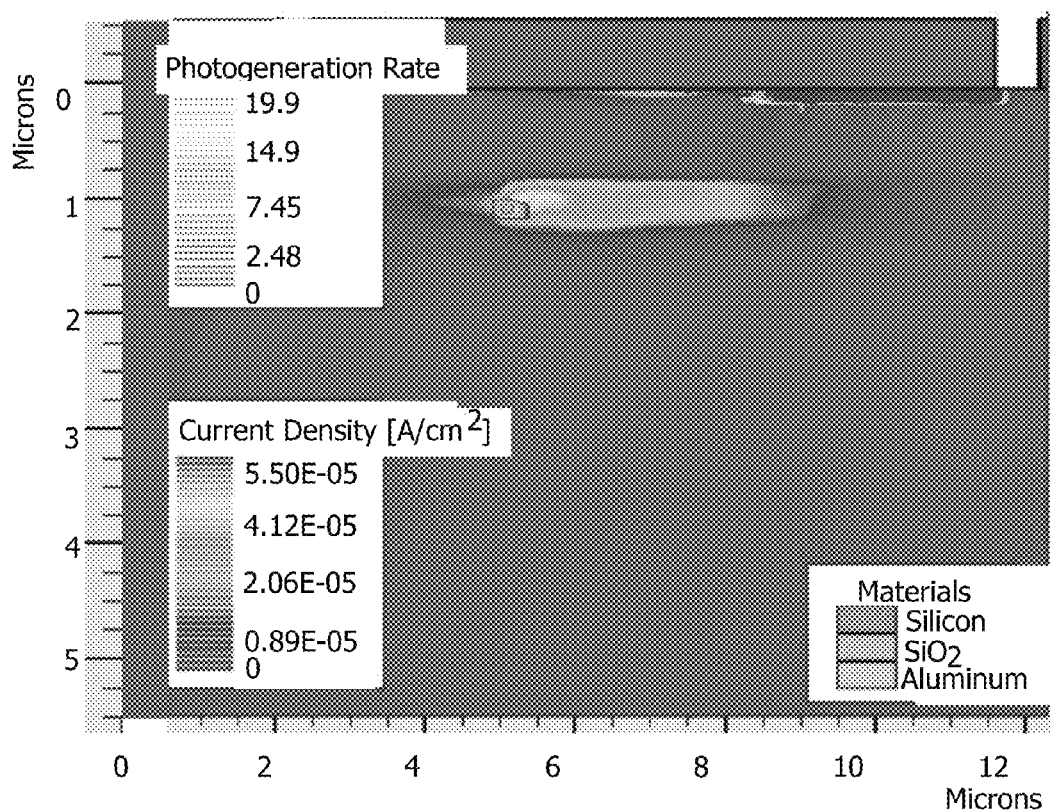

In the simulation, excess carriers where introduced (generated) in different locations on the grid of the device. The generation centers where of limited volume to simulate local generation. Then the minority carriers (electrons in the case of the N+P design) current was examined when the diode is biased with breakdown voltage. T The simulation results for two generation centers are shown in FIG. 14A. FIG. 14A shows the electron current from a generation center located under the planar junction where most of the carriers reach the planar region of the junction. FIG. 7.*b* shows the electron current from a generation center located laterally away from the planar region of the junction and beneath it, in this case most of the electron current reaches the periphery of the junction.

When pixel size gets smaller, simulation shows that an increasing portion of the photogenerated carriers reach the periphery of the junction. This conclusion fits well with the knowledge that the junctions in active pixel sensors (APS) collect carriers from the periphery of the junction. Furthermore, the above conclusion shows the crucial importance of the uniform breakdown all over the junction. Without uniform breakdown, most of the generated carriers will go virtually undetected in small detectors and pixels.

Since in the design presented the breakdown is uniform all over the junction, it is enough to examine the portion of the available generation current (caused by illumination of the device) that reaches the desired terminal. The results are shown in FIG. 12 where there is a comparison between four designs.

The first three designs are based on the retrograde well effect in the N+P design with different CS doping concentrations. The last design is based on the P+N design. All of the devices where simulated according to the fab's manufacturing capabilities. The retrograde well N+P design exhibits considerably better collection efficiency. Simulation shows that almost every charge carrier generated in the deep Pwell will reach the multiplication region under the assumption of long lifetime.

Figure 15:
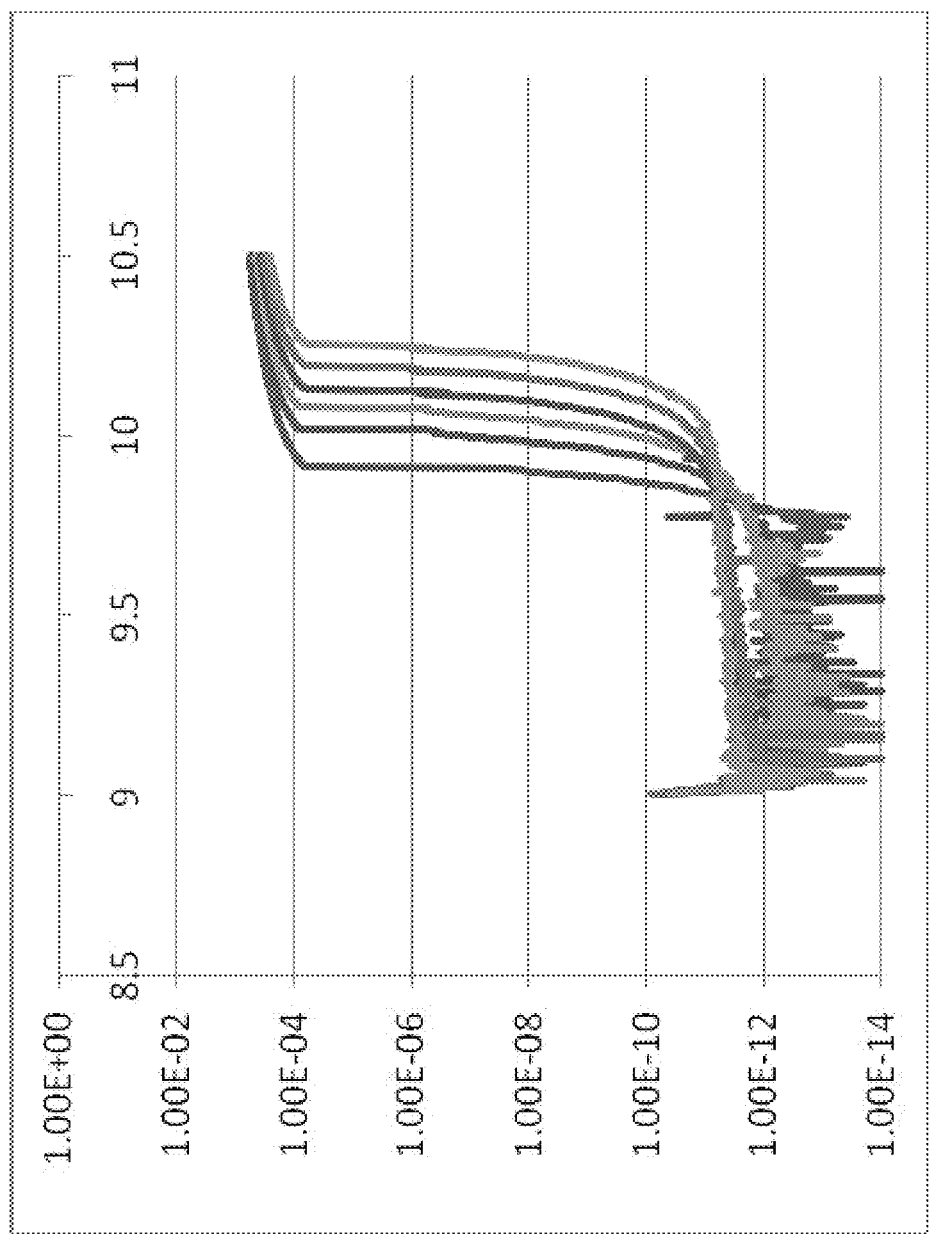
FIG. 15 illustrates I-V characteristics of the P+N and N+P designs, according to embodiments of the invention.

We gather together the results for the P+N and N+P designs on single plots to allow comparison of their relative properties. All devices have an active area diameter of 6 μm. A temperature dependant measurement was conducted, the results for the P+N and N+P designs are shown in FIGS. 15 and 16 respectively.

The breakdown shows a clear exponential rise in current over ~100 mV prior to the Geiger breakdown. This very clear and abrupt breakdown suggests a uniform breakdown all over the junction periphery.

Measurements of the breakdown voltage versus temperature show positive temperature coefficients of +6 mV/° C. for the P+N design and mV/° C. for the N+P design confirming avalanche breakdown.

Figure 16:
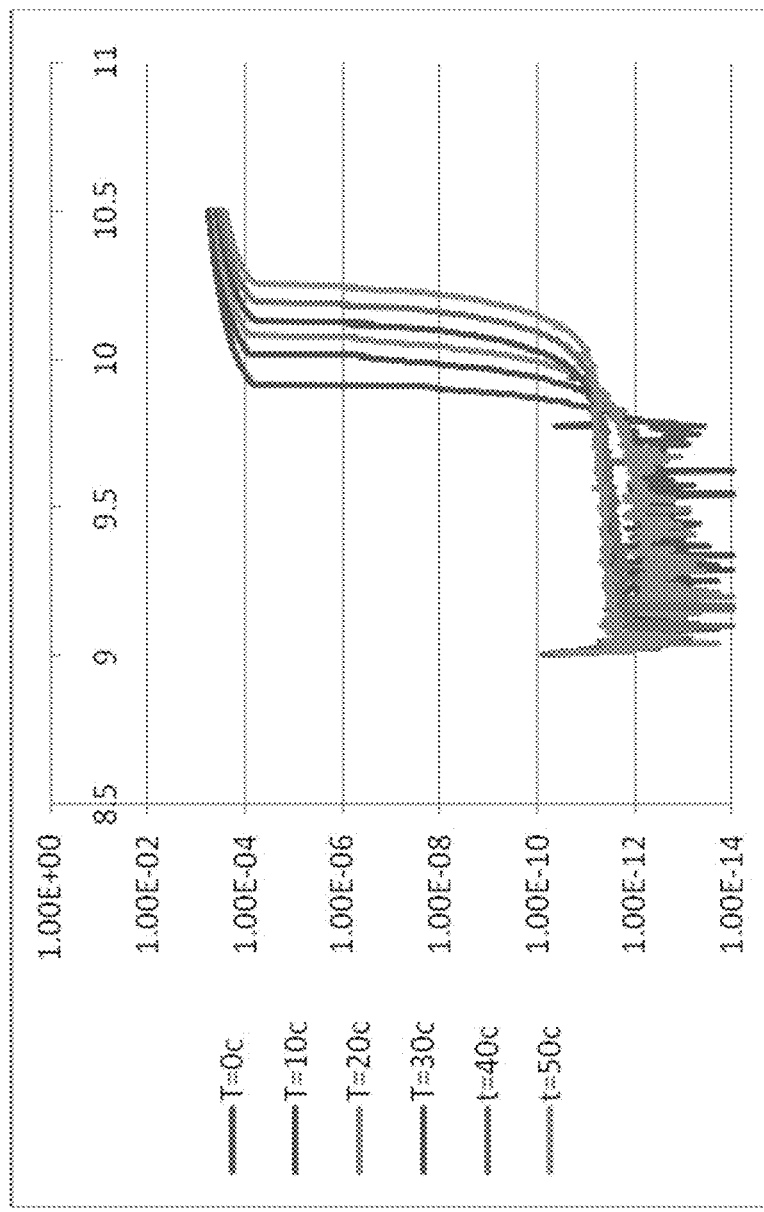
FIG. 16 illustrates I-V characteristics of the N+P design with different temperatures, according to embodiments of the invention.

In FIG. 16, a comparison of the spectral response of the devices reveals the expected relationship between the depth of the junction and the peak PDE.

Figure 17:
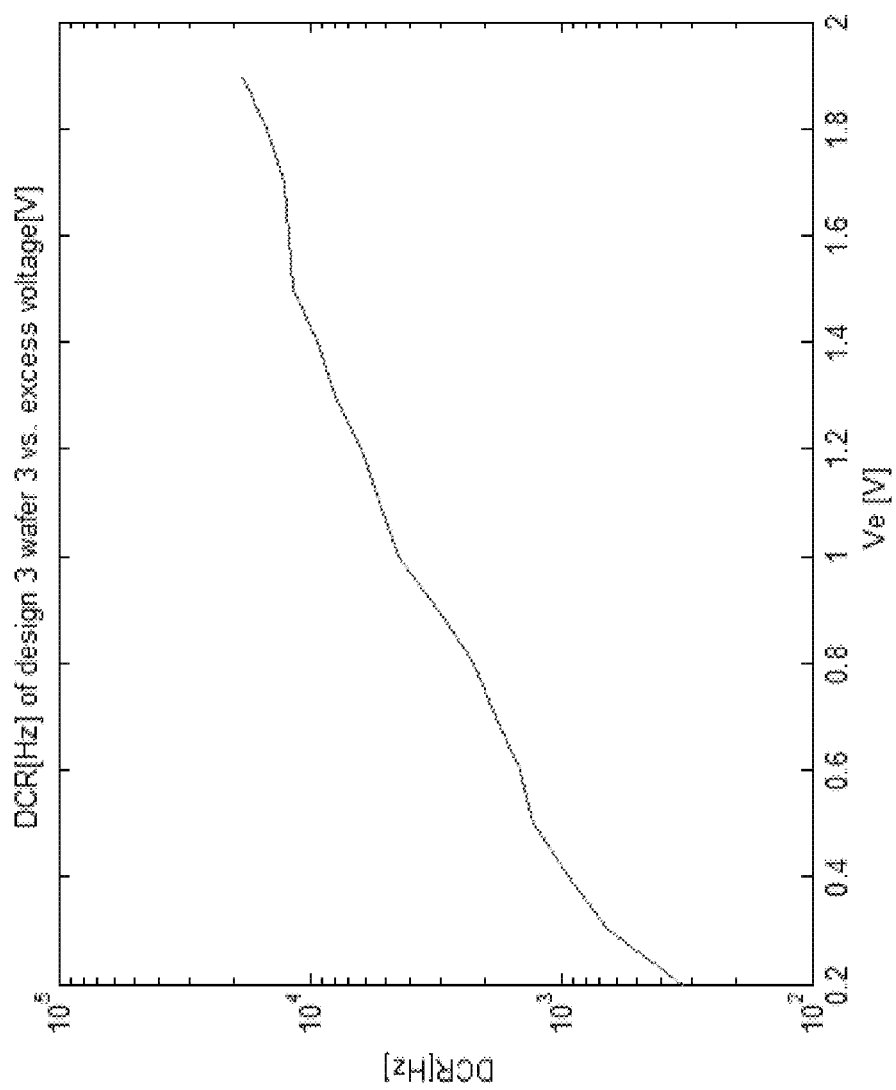
FIG. 17 illustrates measured DCR Vs. the excess voltage of the P+N and N+P design, T=20° C., according to embodiments of the invention.
Figure 18:
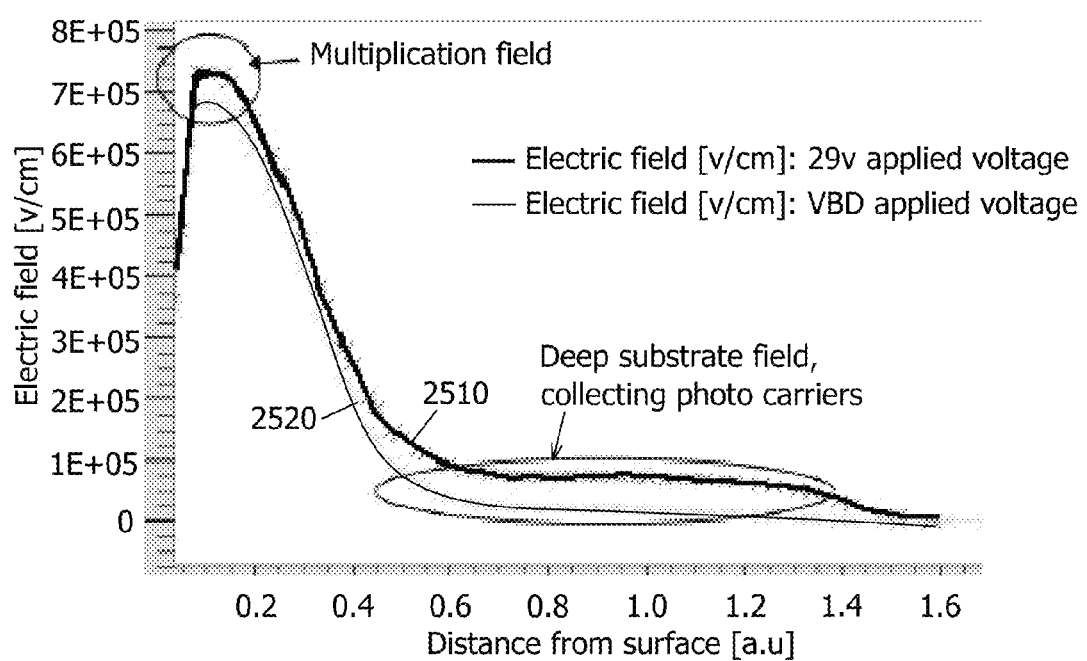
FIG. 18 illustrates a cross sectional view of the electrical field in the APD across virtual line AA' and beyond breakdown.

FIGS. 17 and 18 illustrate the variation of the DCR with excess bias voltage and temperature.

The following figures illustrate the results of various measurements and simulations obtained in relation to an avalanche photodiode (APD) that can also be a SPAD.

Figure 19A:
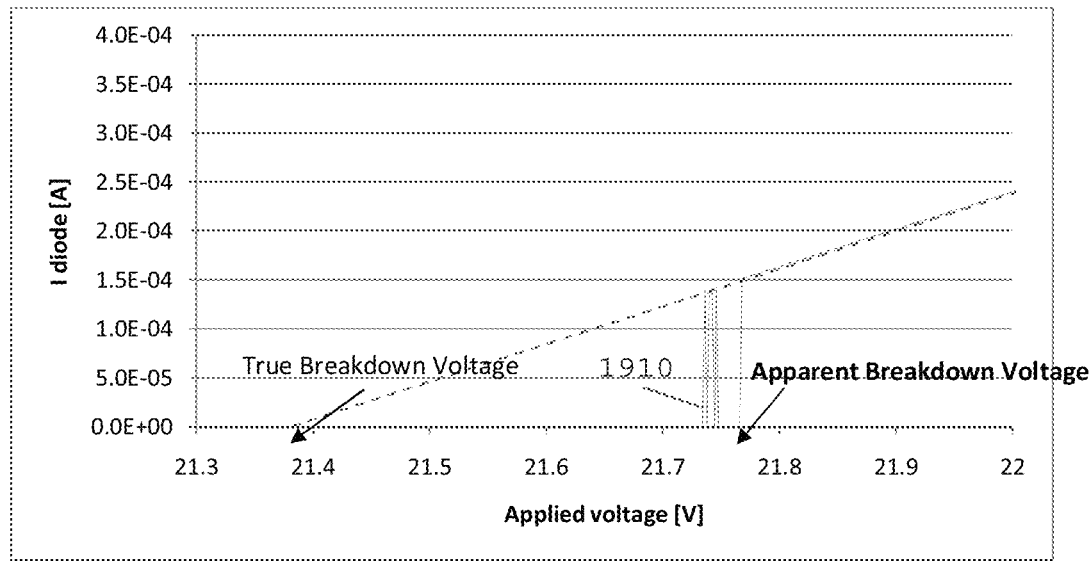
FIG. 19A exhibits measured current-voltage (I-V) characteristics of an APD plotted in a linear scale according to an embodiment of the invention.
Figure 19B:
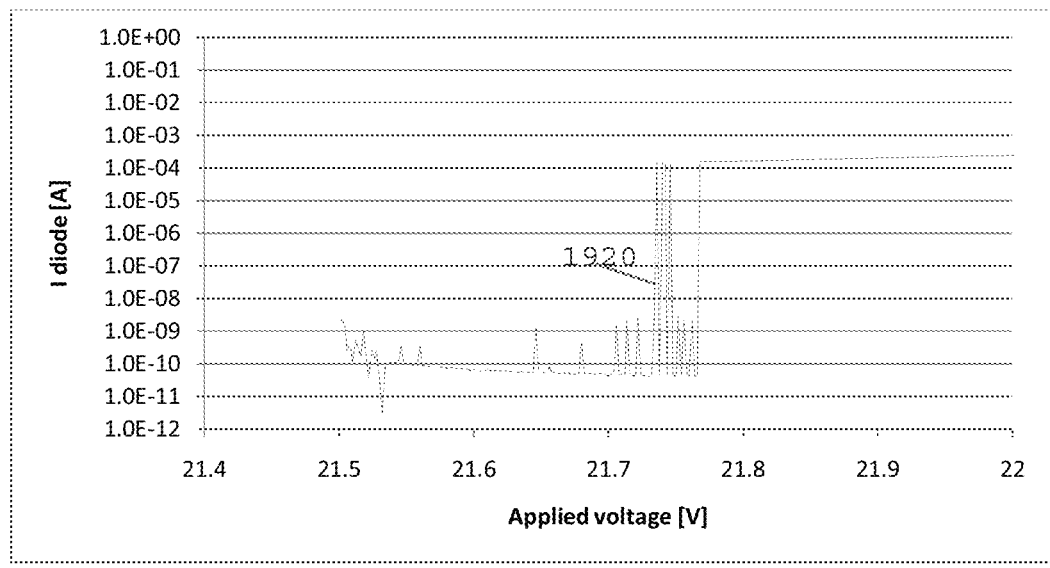
FIG. 19B illustrates a measured current-voltage characteristics of an APD plotted in a logarithmic scale according to an embodiment of the invention.

FIG. 19A exhibits measured current-voltage (I-V) characteristics of an APD plotted in a linear scale according to an embodiment of the invention and FIG. 19B illustrates a measured current-voltage characteristics of an APD plotted in a logarithmic scale according to an embodiment of the invention.

The I-V characteristic (curves 1910 and 1920 of FIGS. 19A and 19B respectively) is abrupt on a logarithmic scale, indicating a uniform avalanche breakdown.

The apparent breakdown voltage is 21.76V while the true breakdown voltage is 21.4V. For applied voltages below 21.76V not a single DCR pulse was triggered during most measurement points indicating very low DCR. Few avalanche events are triggered before a continuous I-V characteristics is measured (indicated in the figure).

Figure 20:
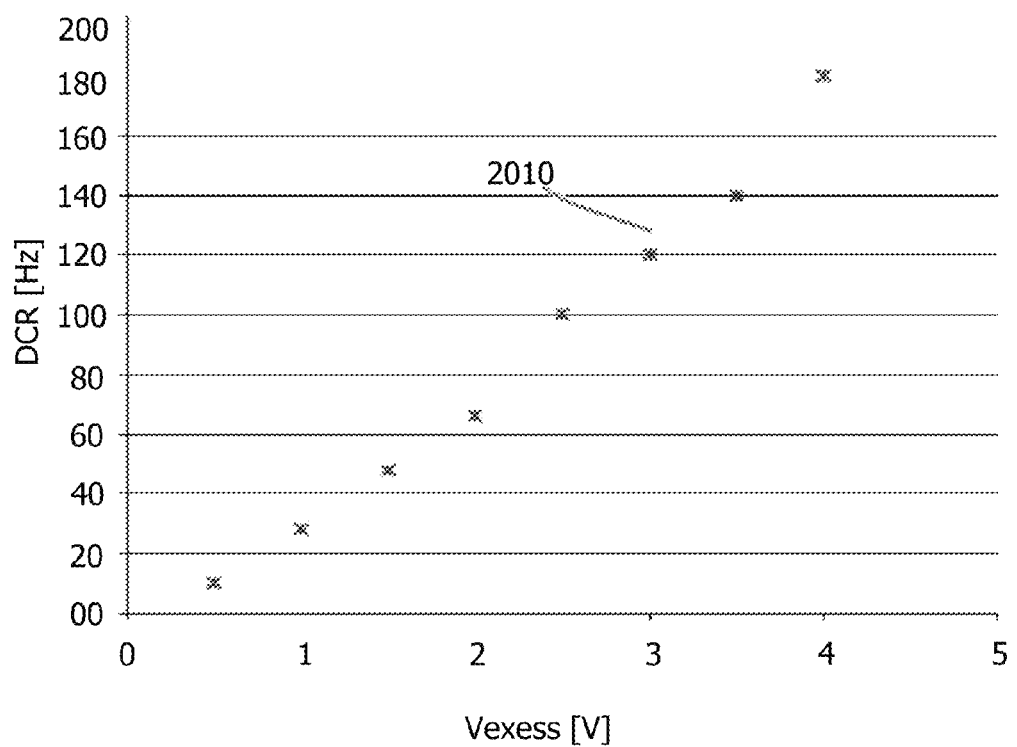
FIG. 20 illustrates measured DCR of a APD at a temperature of 20° C. according to an embodiment of the invention.

FIG. 20 illustrates a group of spots 2010 that represent measured DCR of a APD at a temperature of 20° C. A low DCR below 100 Hz is measured even for excess voltage as high as 2.5V. The true breakdown voltage of the APD is estimated by extrapolating the measured I-V curve where the curve is linear backwards to find the intersect with the voltage axis, as shown in FIG. 19A. The I-V curve becomes continuous, steady state and linear well above this voltage.

The few current pulses, appearing as instabilities, before the I-V becomes continuous, indicate a low DCR APD, as shown in FIG. 20.

The I-V characteristics are measured using a well-established testing tool known as a SPA—Semiconductor Parameter Analyzer. The measurement is performed in such a manner that the voltage supply is shut off prior to the measurement of each point, resetting the APD. The integration time of the SPA is ~100 mseconds, so in the first couple hundred millivolts above breakdown where the DCR is only a few Hz (some hundred milliseconds between events) there is a non-negligible chance that over the whole integration time not a single event occurs. In the measurement presented it is clear that there is a transition period where over some integration times an event occurs while over others an event does not occur. Only after approximately 360 mV is the DCR high enough to display a seemingly continuous, steady state I-V curve.

The measured breakdown voltage temperature dependence is approximately 40 mV/° C. This positive and relatively high value of the temperature coefficient provides an additional indication of the low-DCR nature of the APD. DCR is mainly determined by a combination of Geiger avalanche, which exhibits positive temperature coefficient and tunneling, which exhibits negative temperature coefficient. High temperature coefficients indicate a breakdown free of tunneling effects, thus suggesting the DCR is solely composed of thermal generation. It is interesting to note that APDs with a breakdown voltage of ~10V exhibited breakdown voltage temperature dependence with a value of few mV/K and DCR of ~100 kHz, fabricated utilizing the same CMOS technology. Therefore, I-V-T characteristics can also be used to provide some indication of the quality of the APD in terms of DCR.

PDE is, in principle, the digital equivalent of quantum efficiency (QE). In practice, there is a significant difference between the two parameters: a regular photodiode collects photo-carriers from all the parts of the pixel which absorb radiation, and hence the QE is determined by the junction area as well as the diffusion length of the minority carrier. In contrast, avalanche is triggered only in the active region where multiplication occurs. As a result, while measuring the percentage of the collected photo-carriers, we measure in fact PDE*(Fill Factor).

Figure 21:
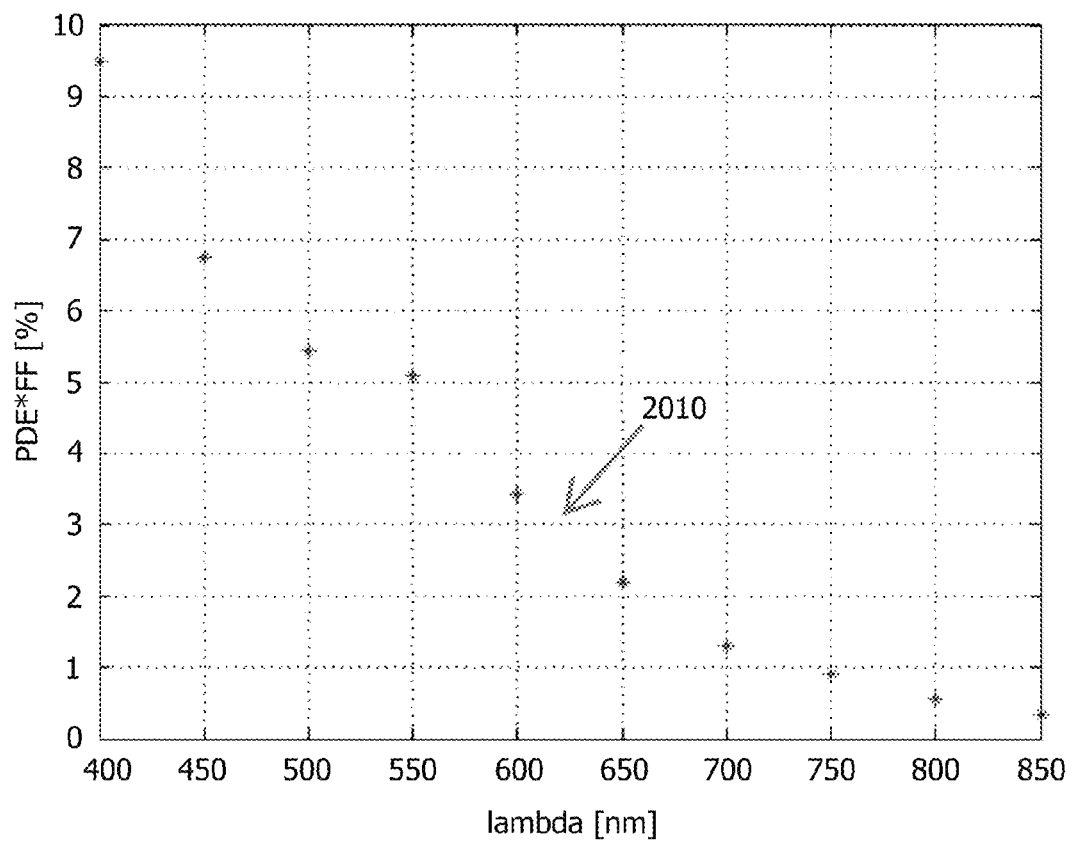
FIG. 21 exhibits the measured (PDE*Fill Factor) of the APD of FIGS. 19A, 19B and 20 according to an embodiment of the invention.

FIG. 21 exhibits a set of points 2110 that represents the measured (PDE*Fill Factor) of the APD of FIGS. 19A, 19B and 20 according to an embodiment of the invention.

The basic setup for PDE measurement is similar to QE measurement. The device under testing (DUT), namely, the SPAD (along with quenching and buffering), is illuminated by a narrow bandwidth (~10 [nm]) light source. In parallel, the light intensity is recorded by a reference detector. The light intensity allows calculating average incident photon frequency upon DUT. DUT output, unlike QE, is measured in average triggering frequency, instead of analog current/voltage. Thus, SPAD's output is recorded by a frequency counter.

It is advisable to maintain light intensity sufficiently low, that is, enabling SPAD complete recuperation between successive triggers (dead time<<reciprocal of average triggering frequency). If the condition is not met than the reliability of the measurement degrades due to following considerations: (i) Some of the quenching pulses will not be registered by frequency counting equipment (measured result will be lower than the real); (ii) The effective excess voltage will be less than the one dictated by the "stand-by" state (again, degrading the measured result as opposed to the real one).

On the other hand, decreasing light intensity too much may cause unreliable measurement as well due to following considerations: (i) Additional undesired triggering mechanisms, such as background illumination and non-photonic generation, namely, the dark count rate (DCR), come into play (can be dealt with in post-processing until a certain limit); (ii) Sensitivity of the reference detector.

Thus, an optimum light intensity is to be set as a function of quenching circuitry bandwidth versus undesired triggering mechanisms and reference detector sensitivity. As a rule of thumb, "dead time" times average triggering frequency should not exceed 0.2-0.15. It can be shown mathematically that the equality to 0.15 guarantees less than 1% error in SPAD output frequency versus the expected frequency.

State of the art CMOS processes (180 nm and below) offer a triple well process originally employed to completely isolate p-well regions containing the NMOS transistors from the substrate thus limiting substrate noise effects. These processes are characterized by deep, high-energy ion implantation steps, the formation of deeply buried highly doped implants, and retrograde doping profiles where doping increases from a lower level at the surface to a higher level deeper into the wafer. These characteristics allow for the formation of layers that act as both field-enhancers and virtual guard rings.

The device cross section is shown in FIG. 22. It is comprised of a 12 µm diameter, shallow, circular P+ region with a 10 µm diameter n-type charge sheet centered below it and formed by ion implantation. This charge sheet defines the active region, where avalanche multiplication occurs. The high field region, which forms the active region, extends vertically 0.4 µm beyond the P+ region, as discussed below. A second n-well is implanted with a retrograde doping profile to comprise the deep n-well. The retrograde characteristic of the layer causes the doping to be effectively P− around the periphery of the P+ region creating a virtual 3D guard ring. Deeper into the wafer the n-type doping rises which also acts to enhance the charge collection to the active region.

Figure 22A:
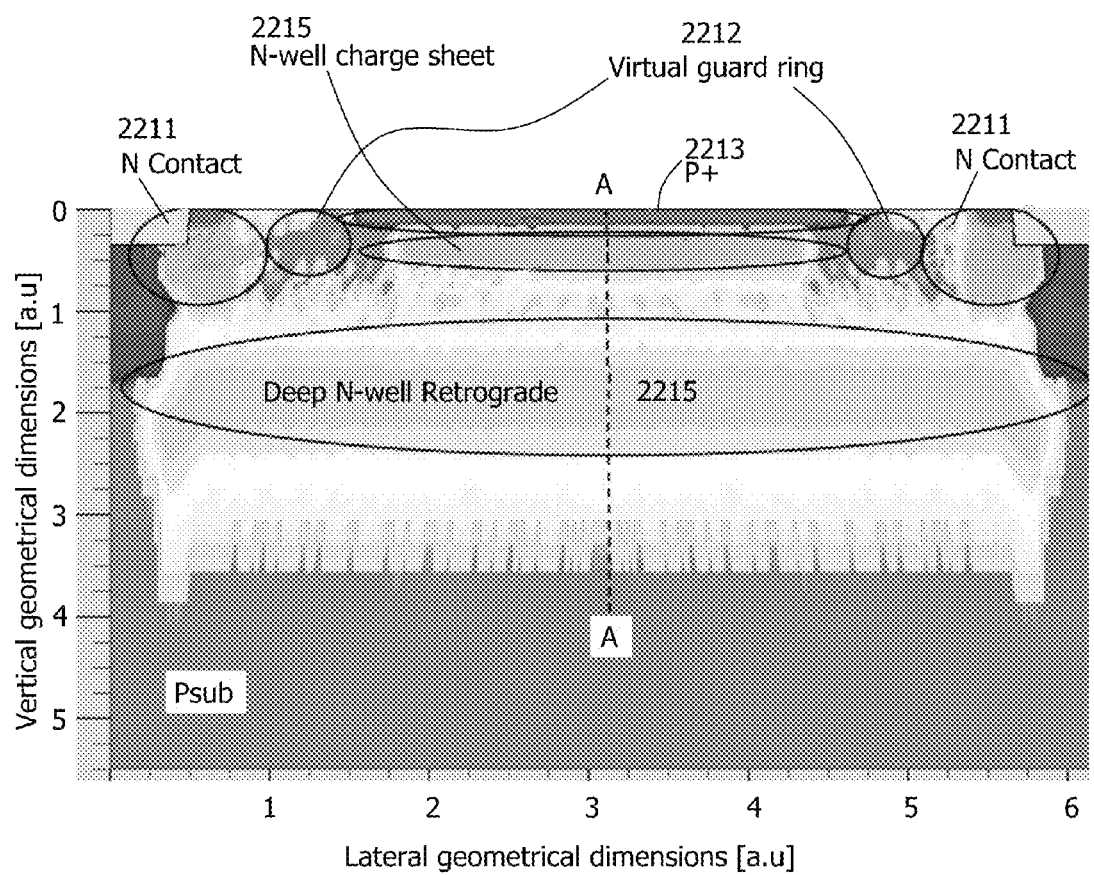
FIG. 22A is a two dimensional cross section of the net doping profile according to an embodiment of the invention.
Figure 22B:
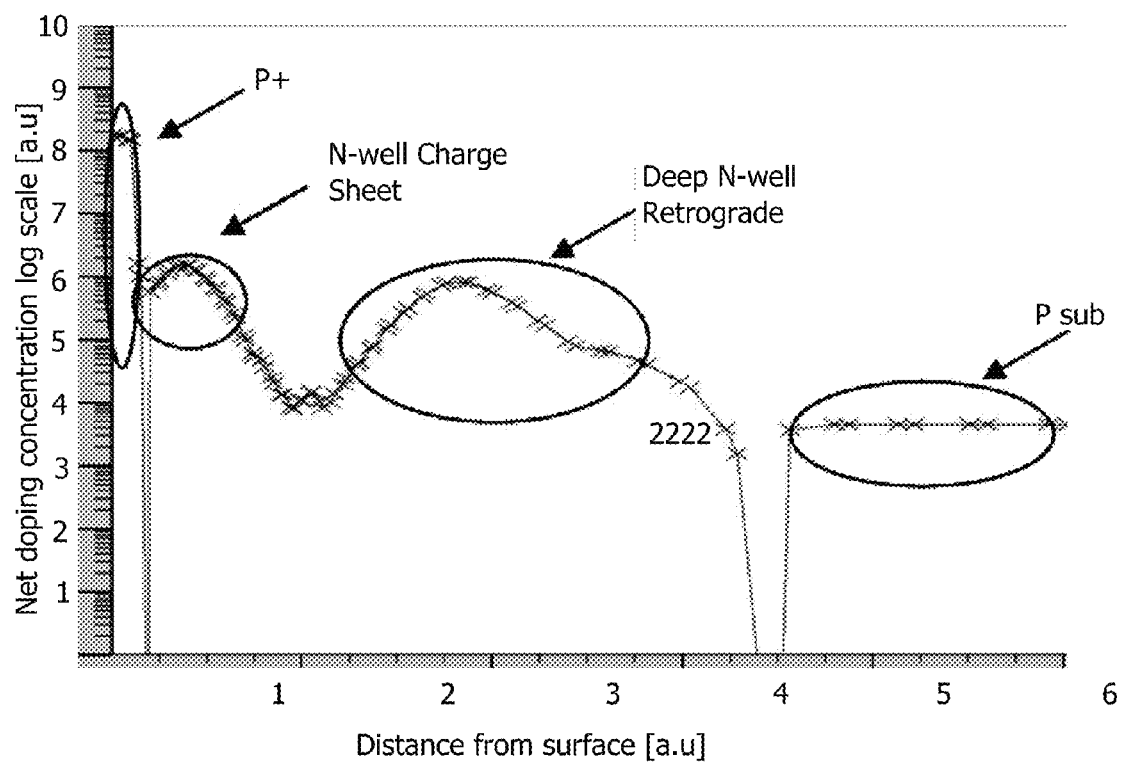
FIG. 22B is a gertical cross section of the net doping according to an embodiment of the invention.

FIG. 22A is a two dimensional cross section 2210 of the net doping profile according to an embodiment of the invention it also shows N-contacts 2211, virtual guard ring 2212, P+ region 2213, N-well charge sheet 2214 and deepn N-well retrogate 2215. FIG. 22B includes curve 2222 that represents a gertical cross section of the net doping through AA' according to an embodiment of the invention. The junction is approximately 0.15 µm from the surface of the device. The Retrograde effect is clearly demonstrated: the higher doping at deeper depth (1.8 a.u.) into the substrate increase PDE of photo-carriers generated deeper in the well.

This doping profile was simulated using Silvaco's Athena process simulator calibrated to the Fab's specifications and is shown in FIG. 22A. Due to the cylindrically symmetric geometry of the device, two dimensional simulations were conducted along one diameter under this symmetrical assumption. These simulations incorporated the Fab's actual thermal diffusion effects and offer an accurate depiction of the resulting doping. The results show the virtual guard ring: around the P+ periphery the doping remains p− while the implanted n-type charge sheet enhances the field in the region immediately above it. While the retrograde character of the deep n-well isn't so apparent from this result, a vertical cross section extending into the device displays it well, as shown in FIG. 22B.

Figure 23:
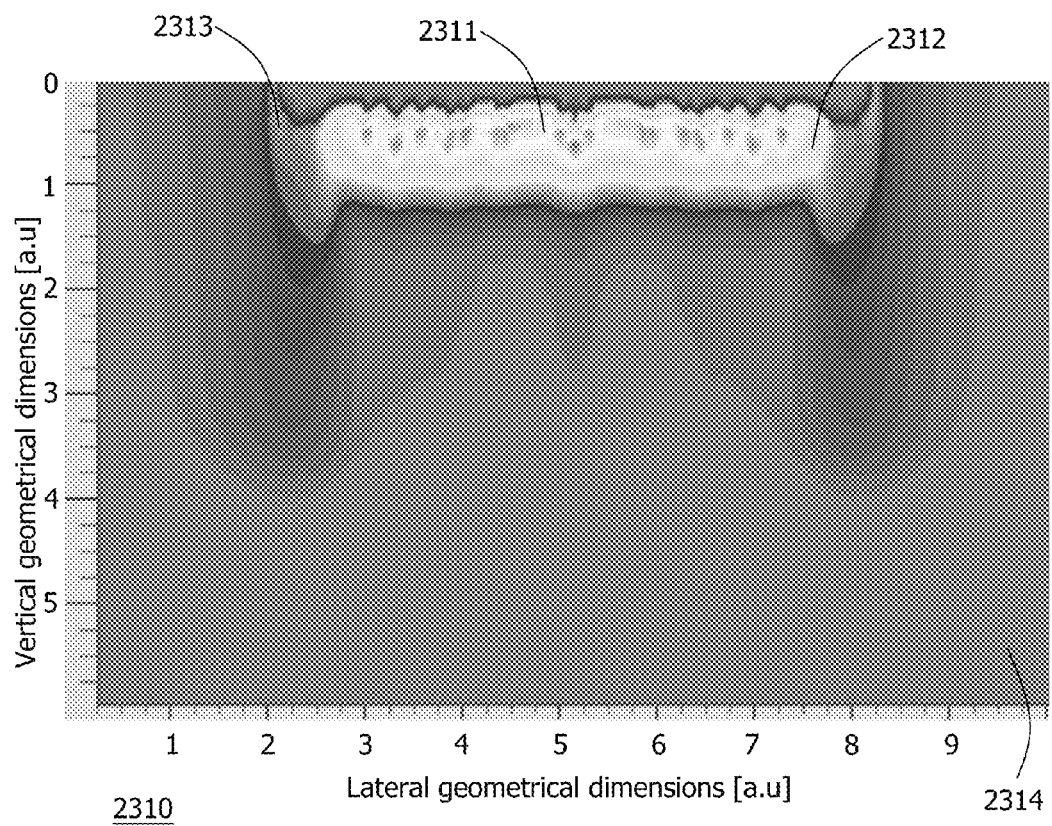
FIG. 23 is a two dimensional electric field profile according to an embodiment of the invention.

FIG. 23 is a two dimensional electric field profile according to an embodiment of the invention it includes multiple regions of different electric field strength 2311-2314 that surround each other. Simulation shows a well-placed avalanche area in the active region. The electric field profile was simulated using Silvaco's Atlas device simulator based on the device's process simulation by Silvaco's Athena program. The results show that the high-field region is localized to the active junction area, and drops steeply within a short distance at the edges of the active region.

Figure 24A:
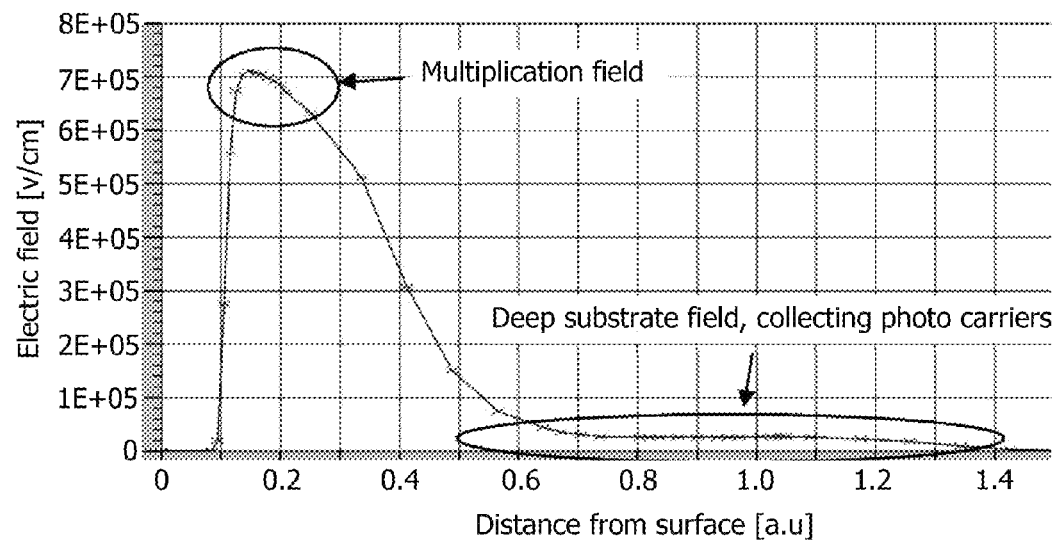
FIGS. 24A-24B are cross sections of the electrical field according to an embodiment of the invention.
Figure 24B:
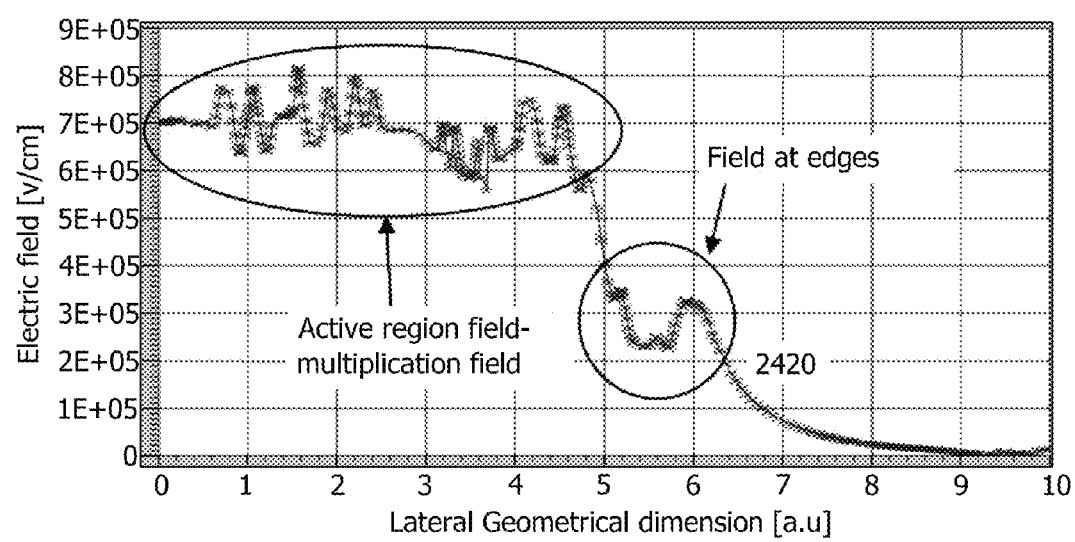

Cross sections (FIGS. 24A and 24B) of the field include curves 2410 and 2420 that show the lateral uniformity (FIG. 24A) and the field profile as it extends into the device (FIG. 24B). The electric field shows high values appropriate to avalanche breakdown in a typical width of approximately 0.4 µm. As such, it is clear that significant multiplication (breakdown) can only be achieved in the active region. Special care has been taken to tailor the maximum electric field so it will be approximately $$70 \frac{V}{\mu m}$$

where negligible tunneling and maximum Geiger avalanche multiplication is to be expected.

The simulation shows that the design enables well-controlled multiplication field as well as well-controlled multiplication width. These two parameters (electric field, width) also determine the observed breakdown voltage, the Photon Detection Efficiency (PDE) and the parasitic tunneling events, which are responsible for the DCR. A design goal is a peak electric field of approximately $$700\frac{KV}{cm} = 70\frac{V}{\mu m}$$

that will initiate the avalanche process with negligible tunneling effect. The latter is avoided by ensuring sufficiently wide depletion region.

FIG. 24A illustrates a vertical electric field cross section through AA' at breakdown. Peak electric field is 71V/μm according to the design goal. We can also see the field extending deep into the substrate, enhancing PDE by collecting photo-carriers generated in deeper regions. FIG. 24B illustrates a lateral electric field Cross sections through BB' at breakdown indicating the uniformity of the electric field. The small non-uniformity at the active region is a feature of the Monte Carlo simulation. The field in the active region averages at the goal field of 70V/μm and drops quickly once it reaches the edges of the active region, preventing edge breakdown.

FIGS. 24A-24B exhibit a well-controlled electric field, which enhances the efficiency of Geiger breakdown along an adequate multiplication region. The breakdown voltage around 20V indicates that the depletion region is relatively thick, thus limiting tunneling effects. The profile of the simulated electric field is clearly in contrast to a one sided step junction, where the field decreases linearly with distance with a slope dependent on the doping concentration of the less doped region. As a result, the multiplication region of such a junction, in particular with breakdown voltage of ~10V, is very narrow, promoting tunneling, which is then responsible for the high measured DCR.

The simulation also shows that, at breakdown, the electric field extends beyond the CS layer at a much reduced magnitude. This result has a very positive effect on the performance of the device. The existence of the low electric field beyond the CS helps by fixing the electric field in the multiplication region (see curves 2510 and 2520 of FIG. 18 for higher applied voltages (higher Vexcess) leading to a more gradual growth in electric field for increased voltage. Curve 2510 and curve 2520 slightly differ from each other although they are obtained by applying different voltages to the APD. This prevents the field from reaching a critical point, where tunneling effects appear, keeping DCR low. The DCR is expected to increase only with the increased avalanche probability, a result supported by measurement: at 3V of excess voltage increase, the DCR increased by a mere 130 Hz. The extended field also contributes to carrier collection, as photo-generated minority charge carriers generated in the low field region will drift towards the multiplication region under the influence of this field.

A low DCR SPAD design compatible with a commercial low-voltage 180 nm CMOS process was illustrated above. The new design is characterized by the following features: shallow and small planar implanted junction; no surface guard ring; minimal interaction with the surface; deep and buried implanted charge sheet with dimensions corresponding to the shallow junction. The latter provides both an effective guard ring and a well-defined multiplication region.

The key design features leading to the low DCR are discussed, mainly a breakdown voltage target of ~20V assures a depletion region with adequate width and electric field to provide Geiger mode avalanche while reducing the probability of tunneling. The reported results also indicate that the measured I-V and I-V-T characteristics may provide some indication with regards the quality of the SPAD, in terms of the DCR.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A semiconductor device, comprising an avalanche photodiode (APD), the APD comprises:
    a first doped region of a first polarity;
    a buried guard ring of a second polarity, the second polarity is opposite to the first polarity, the buried guard ring is spaced apart from the first doped region and is positioned below the first doped region;
    a well of the second polarity, wherein the well interfaces the first doped region to form a p-n junction; and
    a second doped region of the second polarity, the second doped region is spaced apart from the first doped region.

2. The device according to claim 1, wherein the first polarity is positive and the second polarity is negative.

3. The device according to claim 1, wherein the first polarity is negative and the second polarity is positive.

4. The device according to claim 1 wherein the buried guard ring has a non-uniform doping profile.

5. The device according to claim 4, wherein the non-uniform doping profile is arranged to increase a uniformity of an electrical field formed across the p-n junction when the APD is biased with a bias voltage that facilitates a multiplication of a number of photo-carriers in the depletion region.

6. The device according to claim 4, wherein at least one portion of the doping profile changes as a function of a distance from edges of the positive doped region.

7. The device according to claim 4, wherein the non-uniform doping profile is set to induce a substantially even electrical field across the p-n junction when being biased with a bias voltage that exceeds a breakdown bias voltage.

8. The device according to claim 4, wherein the non-uniform doping profile is set to induce a substantially even electrical field across the p-n junction when being biased with a bias voltage that is below a breakdown bias voltage.

9. The device according to claim 1, wherein an area of the buried guard ring is larger than an area defined by an outer boundary of the first doped region.

10. The device according to claim 1, wherein an area of the buried guard ring is at least three times larger than an area defined by an outer boundary of the first doped region.

11. The device according to claim 1, wherein a sum of (a) an area of a projection of the first doped region on a sensing surface of the APD, and (b) a width of the depletion layer along the sensing surface of the APD is smaller than (c) an area of a projection of the buried guard ring on the surfing surface of the APD.

12. The device according to claim 1, comprising a trench isolation element that is positioned near an external edge of the APD.

13. The device according to claim 1, wherein the APD is without a trench isolation element.

14. The device according to claim 1, wherein the first doped region, and the buried guard ring are planar.

15. The device according to claim 1, wherein an area of the sensing surface of the APD does not exceed 30 by 30 microns.

16. The device according to claim 1, further comprising readout circuitry; wherein the readout circuitry and the APD form a pixel; wherein a fill factor of the pixel exceeds five percents.

17. The device according to claim 1, further comprising readout circuitry; wherein the readout circuitry and the APD form a pixel; wherein a fill factor of the pixel exceeds ten percents.

18. The device according to claim 1, further comprising readout circuitry; wherein the readout circuitry and the APD form a pixel; wherein a fill factor of the pixel exceeds twenty percents.

19. The device according to claim 1, comprising an array of pixels, each pixel comprises an APD and a readout circuit.

20. The device according to claim 1, further comprising a cooling element.

21. The device according to claim 1 wherein the entire buried guard ring is located beneath a surfing surface of the APD.

22. The device according to claim 1, wherein the well comprises at least one sub-region of the second polarity, the at least one sub-region is proximate to an upper edge of the well and has doping concentration value than a doping concentration value of the well.

23. A semiconductor device, comprising an avalanche photodiode (APD), the APD comprises:
a first doped region of a first polarity;
a guard ring of a second polarity that is opposite to the first polarity; wherein the guard ring has a first buried portion that is positioned under the first doped region; wherein the first doped region and the guard ring define a p-n junction;
a well of the second polarity that interfaces the guard ring; and
a second doped region of the second polarity that is spaced apart from the first doped region.

24. The device according to claim 23, wherein the first polarity is positive and the second polarity is negative.

25. The device according to claim 23, wherein the first polarity is negative and the second polarity is positive.

26. The device according to claim 23, wherein the guard ring has a non-uniform doping profile.

27. The device according to claim 26, wherein the non-uniform doping profile is arranged to increase a uniformity of an electrical field formed across the p-n junction when the APD is biased with a bias voltage that facilitates a multiplication of a number of photo-carriers in the depletion region.

28. The device according to claim 26, wherein at least one portion of the doping profile changes as a function of a proximity to a sensing surface of the APD.

29. The device according to claim 26, wherein at least one portion of the doping profile increases as a function of a proximity to a sensing surface of the APD.

30. The device according to claim 26, wherein at least one portion of the doping profile changes as function of a distance from edges of the first doped region.

31. The device according to claim 26, wherein the non-uniform doping profile is set to induce a substantially even electrical field across the p-n junction when being biased with a bias voltage that exceeds a breakdown bias voltage.

32. The device according to claim 26, wherein the non-uniform doping profile is set to induce a substantially even electrical field across the p-n junction when being biased with a bias voltage that is below a breakdown bias voltage.

33. The device according to claim 23, wherein an area of the guard ring is larger than an area defined by an outer boundary of the first doped region.

34. The device according to claim 23, wherein an area of the guard ring is at least three times larger than an area defined by an outer boundary of the first doped region.

35. The device according to claim 23, wherein a sum of (a) an area of a projection of the first doped region on a sensing surface of the APD, and (b) a width of the depletion layer along the sensing surface of the APD is smaller than (c) an area of a projection of the guard ring on the surfing surface of the APD.

36. The device according to claim 23, comprising a trench isolation element that is positioned near an external edge of the APD.

37. The device according to claim 23, wherein the APD is without a trench isolation element.

38. The device according to claim 23, wherein the first doped region, and the guard ring are planar.

39. The device according to claim 23, wherein an area of the sensing surface of the APD does not exceed 30 by 30 microns.

40. The device according to claim 23, further comprising readout circuitry; wherein the readout circuitry and the APD form a pixel; wherein a fill factor of the pixel exceeds five percents.

41. The device according to claim 23, further comprising readout circuitry; wherein the readout circuitry and the APD form a pixel; wherein a fill factor of the pixel exceeds ten percents.

42. The device according to claim 23, further comprising readout circuitry; wherein the readout circuitry and the APD form a pixel; wherein a fill factor of the pixel exceeds twenty percents.

43. The device according to claim 23, comprising an array of pixels, each pixel comprises an APD and a readout circuit.

44. The device according to claim 23, further comprising a cooling element.

45. The device according to claim 23, wherein the well comprises at least one sub-region of the second polarity, the at least one sub-region is proximate to an upper edge of the well and has doping concentration value than a doping concentration value of the well.

46. A method for sensing photons, the method comprises:
biasing an avalanche photodiode (APD) that comprises: a first doped region of a first polarity; a buried guard ring of a second polarity, the second polarity is opposite to the first polarity, the buried guard ring is spaced apart from the first doped region and is positioned below the first doped region; a well of the second polarity, the well interfaces the first doped region to form a p-n junction; and a second doped region of the second polarity, the second doped region is spaced apart from the first doped region; and
sensing, by a readout circuit coupled to the APD, an avalanche process that is triggered by an impingement of at least one photon on the APD.

47. The method according to claim 46, comprising maintaining an electrical field form across the p-n junction constant while allowing photo-carriers multiplications to occur within a depletion region of the APD.

48. A method for sensing photons, the method comprises:
biasing an avalanche photodiode (APD) that comprises a first doped region of a first polarity; a guard ring of a second polarity that is opposite to the first polarity; wherein the guard ring has a first buried portion that is positioned under the first doped region; wherein the first doped region and the guard ring define a p-n junction; a well of the second polarity that interfaces the guard ring;

and a second doped region of the second polarity that is spaced apart from the first doped region; and sensing, by a readout circuit coupled to the APD, an avalanche process that is triggered by an impingement of at least one photon on the APD.

49. The method according to claim 48, comprising maintaining an electrical field form across the p-n junction constant while allowing photo-carriers multiplications to occur within a depletion region of the APD.

* * * * *